(12) United States Patent
Jung et al.

(10) Patent No.: US 11,812,654 B2
(45) Date of Patent: Nov. 7, 2023

(54) LAMINATION DEVICE, DISPLAY DEVICE, AND MANUFACTURING METHOD OF THE DISPLAY DEVICE

(71) Applicant: Samsung Display Co., Ltd., Yongin-Si (KR)

(72) Inventors: Kyu-Ho Jung, Osan-si (KR); Kyungrok Ko, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 206 days.

(21) Appl. No.: 17/354,351

(22) Filed: Jun. 22, 2021

(65) Prior Publication Data
US 2022/0069264 A1 Mar. 3, 2022

(30) Foreign Application Priority Data
Sep. 3, 2020 (KR) .................. 10-2020-0112106

(51) Int. Cl.
| | | |
|---|---|---|
| H10K 71/00 | (2023.01) | |
| H10K 50/84 | (2023.01) | |
| H10K 59/12 | (2023.01) | |
| H10K 77/10 | (2023.01) | |
| H10K 102/00 | (2023.01) | |

(52) U.S. Cl.
CPC .......... *H10K 71/00* (2023.02); *H10K 50/841* (2023.02); *H10K 59/12* (2023.02); *H10K 77/111* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 9,490,215 B2 | 11/2016 | Yang | |
| 10,357,951 B2 * | 7/2019 | Lee | .......... B32B 41/00 |
| 10,405,438 B2 | 9/2019 | Lee et al. | |
| 10,607,943 B2 | 3/2020 | Kim et al. | |
| 2008/0169063 A1 | 7/2008 | Fang et al. | |
| 2016/0318293 A1 * | 11/2016 | Kim | ........ B32B 38/1841 |
| 2017/0072671 A1 * | 3/2017 | Son | ........ H10K 71/50 |
| 2018/0019267 A1 * | 1/2018 | Saeki | ........ G02F 1/1303 |
| 2018/0086034 A1 * | 3/2018 | Lee | ........ B32B 38/0004 |
| 2020/0074893 A1 | 3/2020 | Li et al. | |
| 2021/0384479 A1 | 12/2021 | Lee et al. | |
| 2021/0407339 A1 * | 12/2021 | Feng | ........ G09F 9/301 |
| 2022/0216452 A1 * | 7/2022 | Kuon | ........ H10K 50/8426 |

FOREIGN PATENT DOCUMENTS

| | | |
|---|---|---|
| KR | 101452214 B1 | 10/2014 |
| KR | 1020150059048 A | 5/2015 |
| KR | 1020180028585 A | 3/2018 |
| KR | 1020190066646 A | 6/2019 |
| KR | 1020210152065 A | 12/2021 |
| KR | 1020210156373 A | 12/2021 |

* cited by examiner

Primary Examiner — J. E. Schoenholtz
(74) Attorney, Agent, or Firm — CANTOR COLBURN LLP

(57) ABSTRACT

A lamination device includes a first jig in which a window is disposed, where a recessed part is defined in a bottom surface of the first jig, and the window is disposed in the recessed part, and a second jig including a seated part disposed in the recessed part, where a display panel is disposed on the seated part to face the window. A through-hole extending from a side surface of the first jig to the recessed part of the first jig is defined in the first jig.

20 Claims, 30 Drawing Sheets

FIG. 15
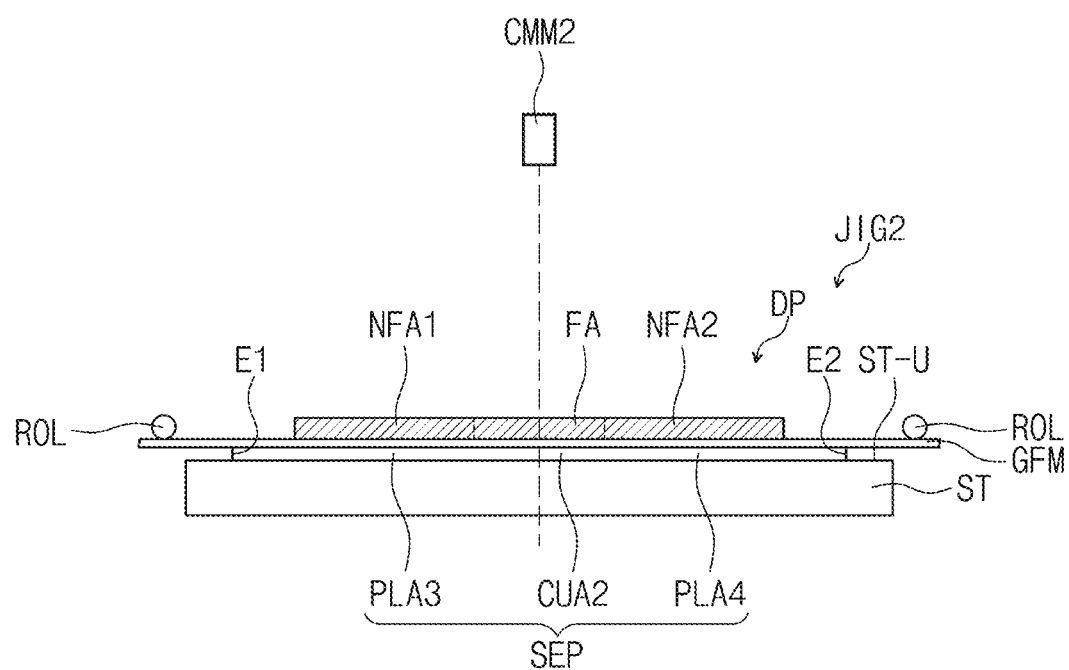
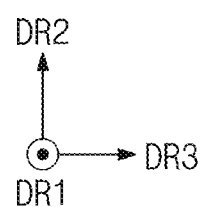

LAMINATION DEVICE, DISPLAY DEVICE, AND MANUFACTURING METHOD OF THE DISPLAY DEVICE This application claims priority to Korean Patent Application No. 10-2020-0112106, filed on Sep. 3, 2020, and all the benefits accruing therefrom under 35 U.S.C. § 119, the content of which in its entirety is herein incorporated by reference.

BACKGROUND

1. Field

The disclosure herein relates to a lamination device, a display device, and a manufacturing method of the display device.

2. Description of the Related Art

Various display devices used in multimedia devices such as televisions, mobile phones, tablet computers, and navigation units are developed. In recent years, a display device that is foldable or bendable to be variously changed in shape is developed.

A portion of various members constituting such a foldable display device may have a bent shape. Particularly, a window that is provided to protect a display panel also has a bent shape according to a shape of the display device. The bent window may be bonded to a display panel by a lamination device.

SUMMARY

The disclosure provides a lamination device capable of bonding a bent window to a bent display panel at an exact position, a display device manufactured by the lamination device, and a method for manufacturing the display device by using the lamination device.

An embodiment of the invention provides a lamination device including: a first jig in which a window is disposed, where a recessed part is defined in a bottom surface of the first jig, and the window is disposed in the recessed part; and a second jig including a seated part disposed in the recessed part, where a display panel is seated on the seated part to face the window. In such an embodiment, a through-hole extending from a side surface of the first jig to the recessed part of the first jig is defined in the first jig.

In an embodiment of the invention, a display device includes: a display panel including a folding area bent with respect to a folding axis extending in a first direction, a first non-folding area extending from one side of the folding area in a second direction crossing the first direction, and a second non-folding area extending from an opposing side of the folding area in the second direction; and a window disposed on the display panel and including a central area and an edge area surrounding the central area. In such an embodiment, a first marking part is defined in the folding area, a second marking part is defined in the non-folding area, and the first marking part and the second marking part overlap the edge area.

In an embodiment of the invention, a method for manufacturing a display device includes: providing a window including a central area and an edge area surrounding the central area to a recessed part defined in a first jig; providing a display panel on a seated part of a second jig, which is disposed below the first jig, to face the window; arranging a first camera module to photograph an alignment mark defined in a non-folding area of the display panel; arranging the window on the display panel; and bonding the window to the display panel. In such an embodiment, the arranging the window on the display panel includes adjusting a position of the window until the edge area of the window overlaps the alignment mark of the display panel through a through-hole extending from a side surface of the first jig to the recessed part.

BRIEF DESCRIPTION OF THE DRAWINGS

The above and other features of the invention will become more apparent by describing in further detail embodiments thereof with reference to the accompanying drawings, in which:

FIGS. 11 to 21 are views illustrating processes of the method for manufacturing the display device described in FIG. 10;

DETAILED DESCRIPTION

Figure 1A:
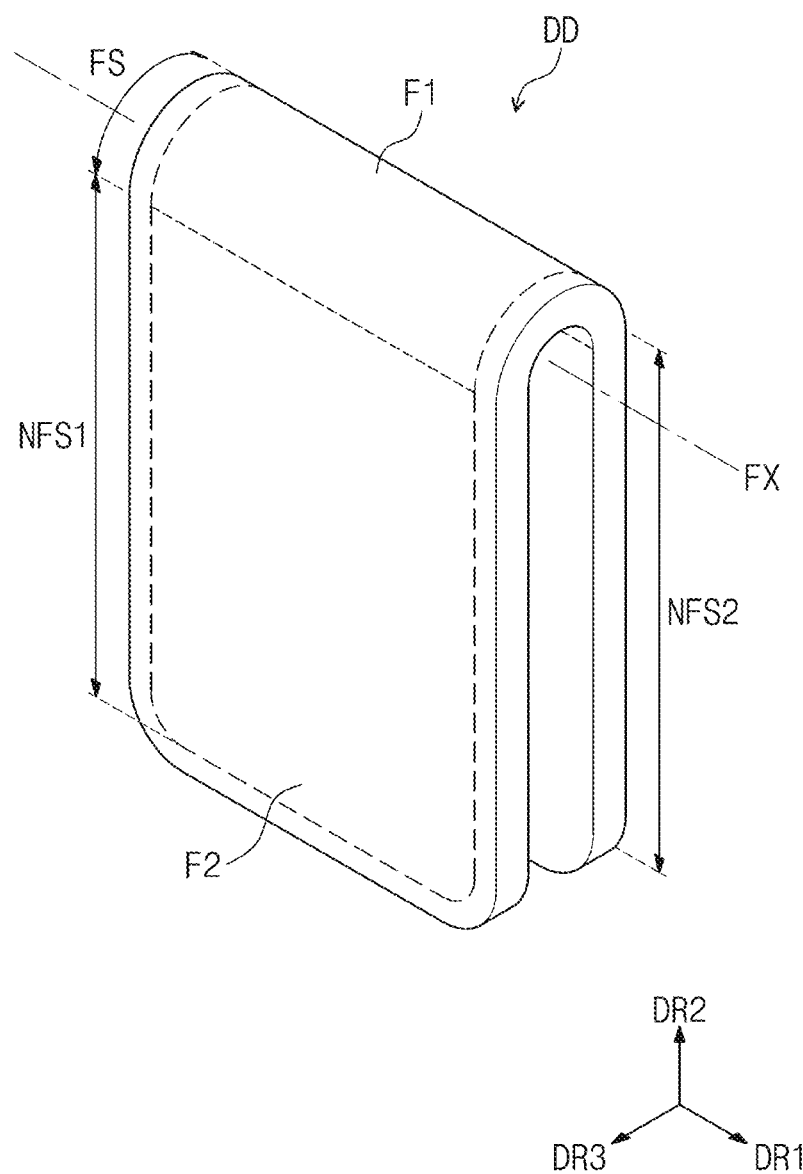
FIGS. 1A and 1B are perspective views illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will also be understood that when one component (or region, layer, portion) is referred to as being "on", "connected to", or "coupled to" another component, it can be disposed/connected/coupled directly on/to the one component, or an intervening third component may also be present. In contrast, when an element is referred to as being "directly on", "connected directly to", or "coupled directly to" another element, there are no intervening elements present.

Like reference numerals refer to like elements throughout. Also, in the figures, the thickness, ratio, and dimensions of components are exaggerated for clarity of illustration.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1B:
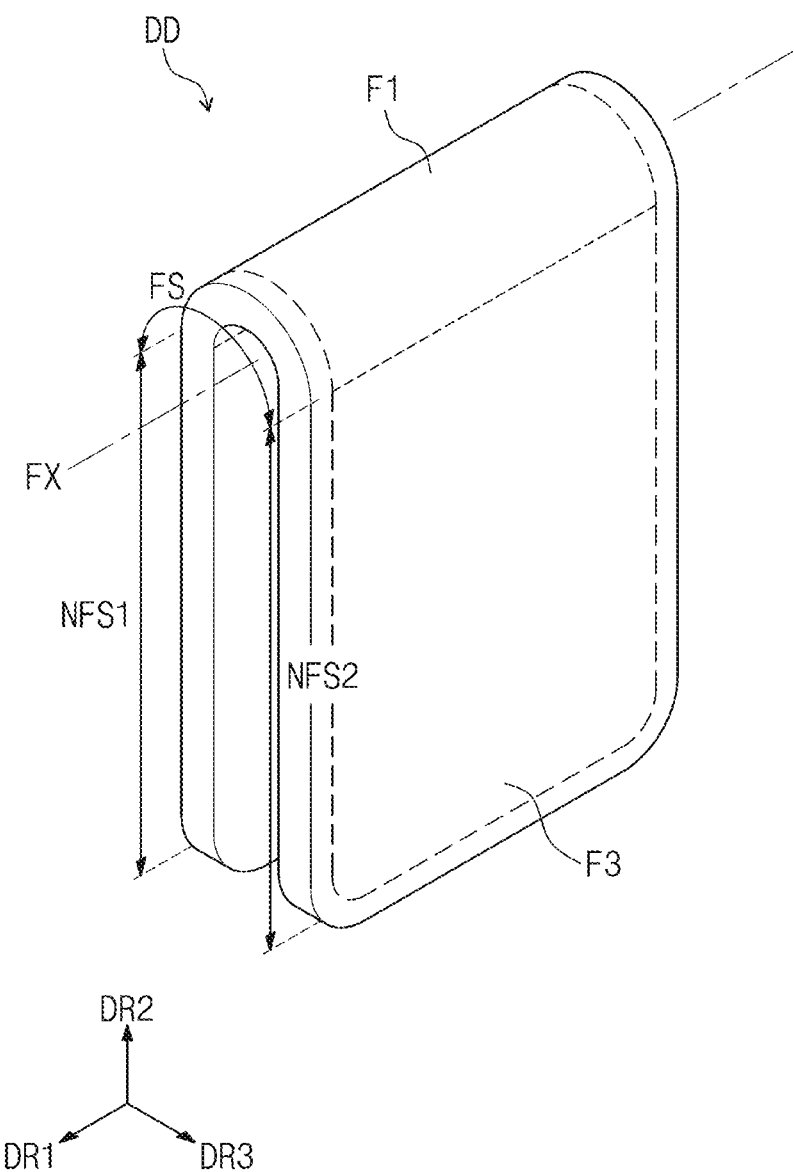

FIGS. 1A and 1B are perspective views illustrating display devices according to an embodiment of the invention.

Referring to FIGS. 1A and 1B, an embodiment of a display device DD according to the invention may display an image. In one embodiment, for example, the display device DD may provide an image to a user through a display surface.

According to an embodiment of the invention, a central portion of the display device DD may be in a folded shape. In an embodiment, the display device DD may include a folding section FS, a first non-folding section NFS1, and a second non-folding section NFS2.

The folding section FS may be folded or foldable with respect to a folding axis FX extending in parallel to a first direction DR1. When viewed in the first direction DR1, the folding section FS may have a reversed U-like shape.

A first surface F1 of the folding section FS may be exposed to an outside. The first surface F1 may be a curved surface. The first surface F1 may display an image.

The first non-folding section NFS and the second non-folding section NFS may extend from opposing side ends of the folding section FS, respectively, in a second direction DR2 crossing the first direction DR1. Herein, as shown in FIG. 1, the second direction DR2 may indicate a vertical direction.

A second surface F2 of the first non-folding section NFS1 and a third surface F3 of the second non-folding section NFS2 may be exposed to the outside. Each of the second surface F2 and the third surface F3 may be a flat surface. In one embodiment, for example, each of the second surface F2 and the third surface F3 may be parallel to a plane defined by the first direction DR1 and the second direction DR2. Each of the second surface F2 and the third surface F3 may display an image.

According to an embodiment of the invention, a portion of the display device DD may be folded to provide an image to the user at various angles.

Figure 2:
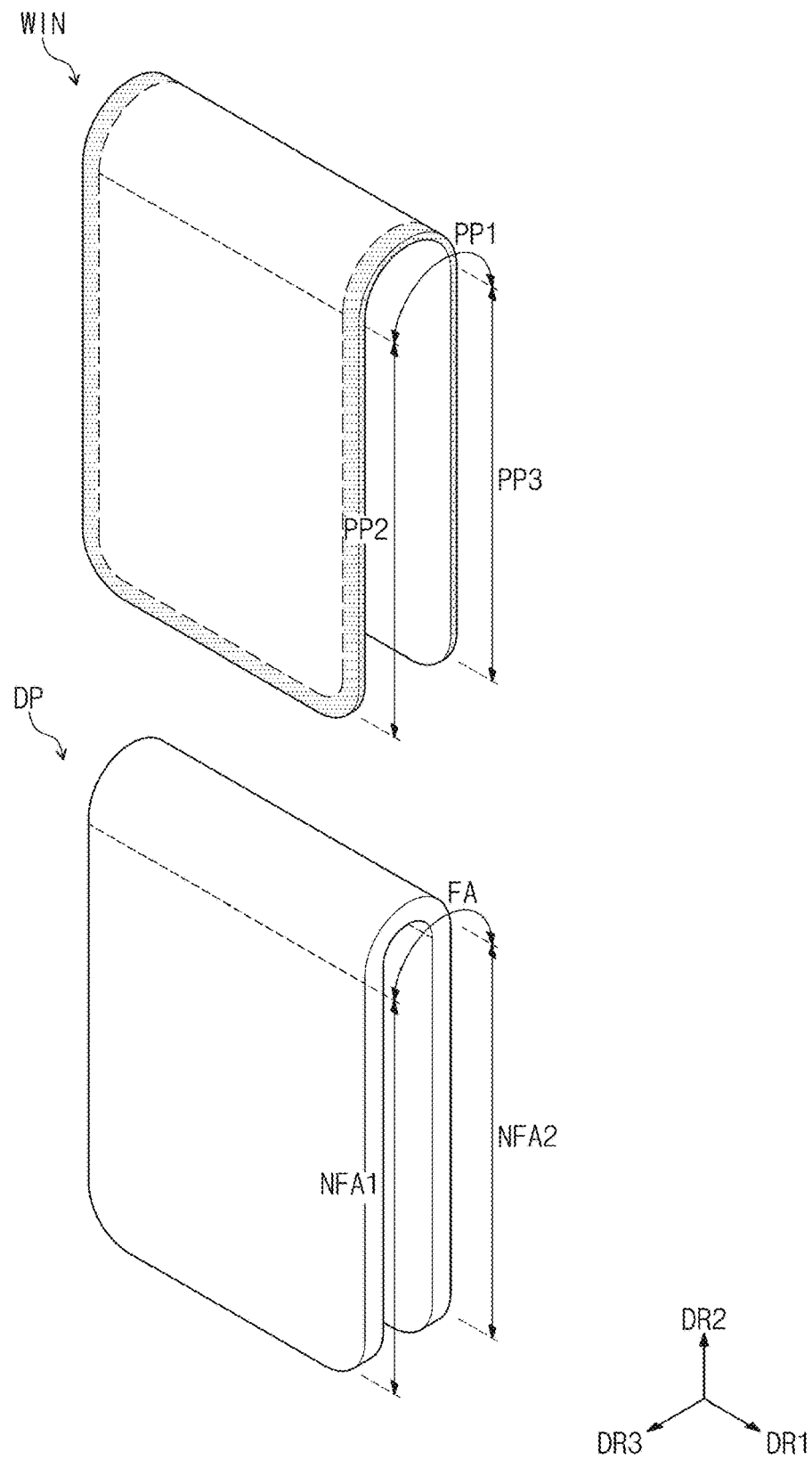
FIG. 2 is an exploded perspective view illustrating the display device in FIG. 1A.
Figure 3:
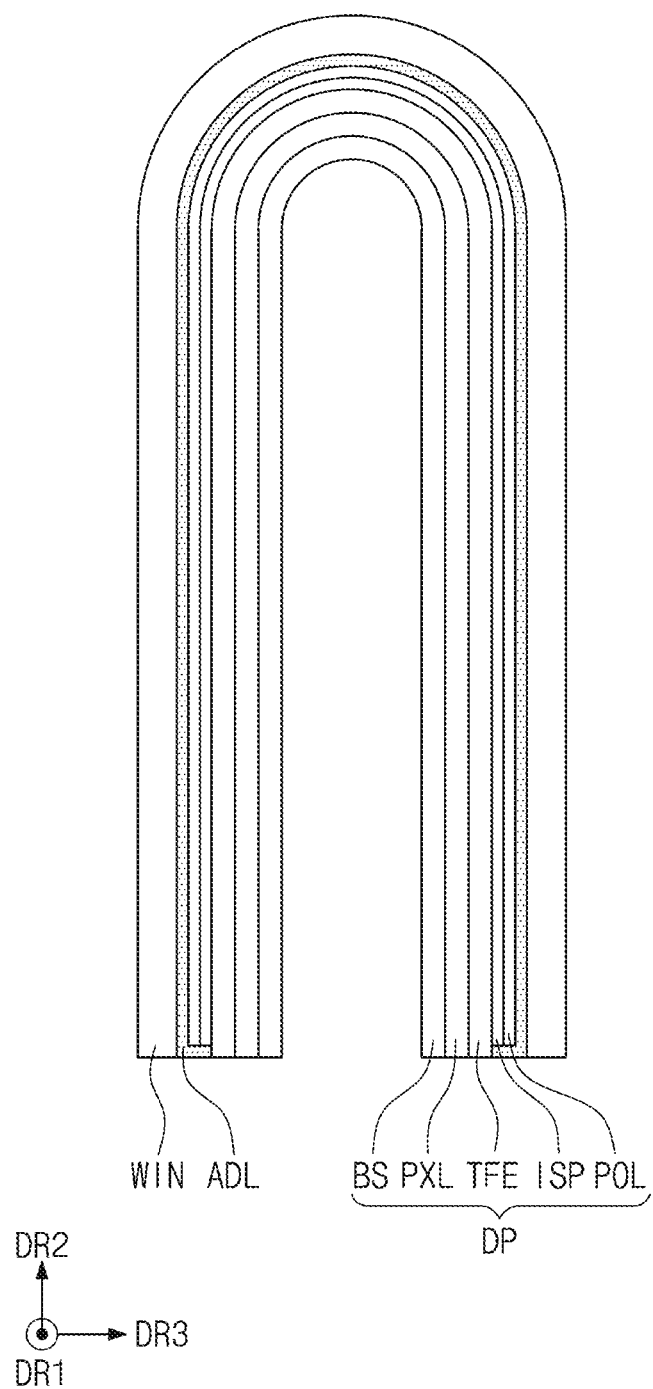
FIG. 3 is a cross-sectional view illustrating the display device in FIG. 1A.

FIG. 2 is an exploded perspective view illustrating the display device in FIG. 1A. FIG. 3 is a cross-sectional view illustrating the display device in FIG. 1A. For convenience of illustration and description, in FIG. 2, a display panel DP and a window WIN are separately illustrated, and an adhesive layer ADL disposed between the display panel DP and the window WIN is not illustrated.

Referring to FIG. 2, an embodiment of the display device DD may include a display panel DP and a window WIN disposed on the display panel DP. A top surface of the display panel DP and a bottom surface of the window WIN may face each other with respect to the second direction DR2.

According to an embodiment of the invention, a central portion of each of the display panel DP and the window WIN may be in a folded shape corresponding to the shape of the central portion of the display device DD in FIG. 1A. In an embodiment, the display panel DP may include a folding area FA folded with respect to the folding axis FX in FIG. 1 and a first non-folding area NFA1 and a second non-folding area NFA2, which extend from opposing side ends of the folding area FA, respectively, in the second direction DR2. The folding area FA may correspond to the folding section FS in FIG. 1A, the first non-folding area NFA1 may correspond to the first non-folding area NFS1 in FIG. 1A, and the second non-folding area NFA2 may correspond to the second non-folding area NFS2 in FIG. 1B.

The window WIN may include a first portion PP1 folded with respect to the folding axis FX in FIG. 1 and a second portion PP2 and a third portion PP3, which extend from opposing side ends of the first portion PP1, respectively, in the second direction DR2. The first portion PP1 may correspond to the folding area FA, the second portion PP1 may correspond to the first non-folding area NFA1, and the third portion PP3 may correspond to the second non-folding area NFA2.

Referring to FIG. 3, the display panel DP may display an image and sense an input of the user. The display panel DP may include a substrate BS, a pixel layer PXL disposed on the substrate BS, and a thin-film encapsulation layer TFE disposed on the pixel layer PXL.

The substrate BS may be a base layer of the display panel DP. The substrate BS may have a flexible substrate. In one embodiment, for example, the substrate BS may include polyimide ("PI"). However, the material of the substrate BS in embodiments of the invention is not limited thereto.

The pixel layer PXL may include a pixel device layer disposed on the substrate BS and a display device layer disposed on the pixel device layer. In one embodiment, for example, the pixel device layer may include an insulation layer, a semiconductor pattern, a conductive pattern, and a signal line. An insulation layer, a semiconductor layer, and a conductive layer may be provided by a method such as coating and deposition, and then the insulation layer, the semiconductor layer, and then the conductive layer may be selectively patterned through a plurality of photolithography processes. Thereafter, the semiconductor pattern, the conductive pattern, and the signal line of the circuit device layer may be provided.

The display device layer may include a light emitting device. In one embodiment, for example, the display device layer may include an organic light emitting material, a quantum dot, a quantum rod, or a micro-light emitting diode ("LED").

The thin-film encapsulation layer TFE may be disposed on the pixel layer PXL. The thin-film encapsulation layer TFE may protect the pixel layer PXL. In one embodiment, for example, the thin-film encapsulation layer TFE may include an inorganic layer, an organic layer, and an inorganic layer, which are sequentially laminated with each other. The inorganic layers may include an inorganic material and protect pixels from moisture/oxygen. The organic layer may include an organic material and protect the pixels from foreign substances such as dust particles.

According to an embodiment of the invention, the display panel DP may further include an input sensing part ISP and an anti-reflection layer POL disposed on the input sensing part ISP.

The input sensing part ISP may include a plurality of sensors for sensing an external input. The sensors may sense the external input in a capacitive method. The external input may include various types of inputs such as a portion of a user's body, light, heat, a pen, or pressure.

The anti-reflection layer POL may be disposed on the input sensing part ISP. The anti-reflection layer POL may be an external light reflection preventing film. The anti-reflection layer POL may reduce a reflectance of external light incident to the display panel DP from above the display device DD. In one embodiment, for example, the anti-reflection layer POL may include a retarder and/or a polarizer.

The display panel DP may include a plurality of adhesive members (not shown). In one embodiment, for example, layers of the display panel DP may be connected by the adhesive member disposed between the adjacent layers.

According to an embodiment of the invention, each of portions overlapping the folding area FA in the layers of the display panel DP may be folded with respect to the folding axis FX in FIG. 1.

According to an embodiment of the invention, the window WIN may be disposed on the display panel DP and protect the display panel DP from external scratches. The window WIN may be fixed to the display panel DP by an adhesive layer ADL. The adhesive layer ADL may include an optically clear adhesive ("OCA"), for example. However, the kind of the adhesive layer ADL in embodiments of the invention is not limited thereto.

The window WIN may include an optically clear material. In one embodiment, for example, the window WIN may include glass or a plastic. The window WIN may have a multilayer structure or a single-layer structure. In one embodiment, for example, the window WIN may include a plurality of plastic films coupled to each other by an adhesive or a plurality of glass substrates and plastic films coupled to each other by an adhesive. An image displayed on the display panel DP may be provided to the user through the window WIN.

Figure 4:
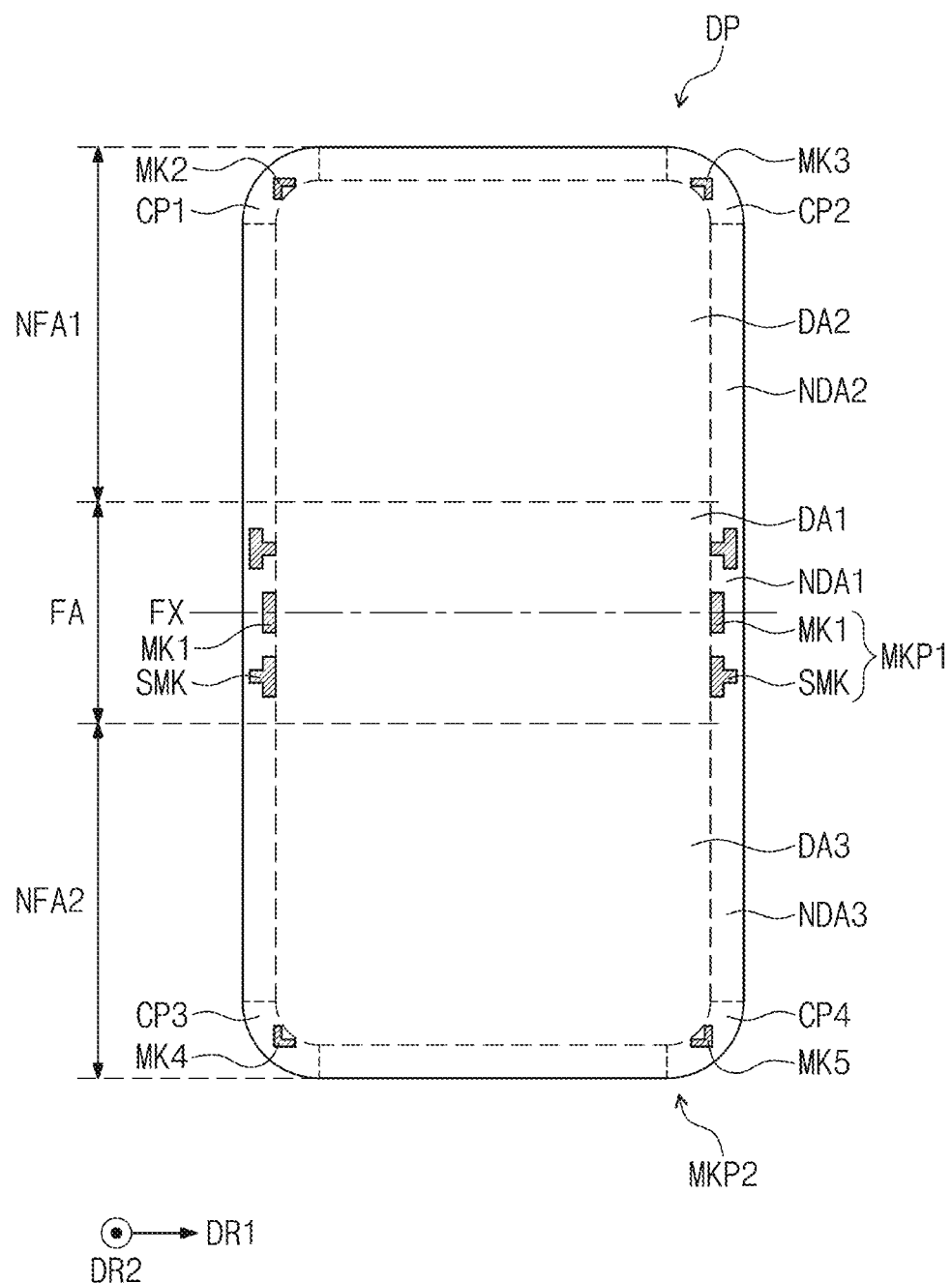
FIG. 4 is a plan view illustrating a display panel in FIG. 2 in an unfolded state.
Figure 5:
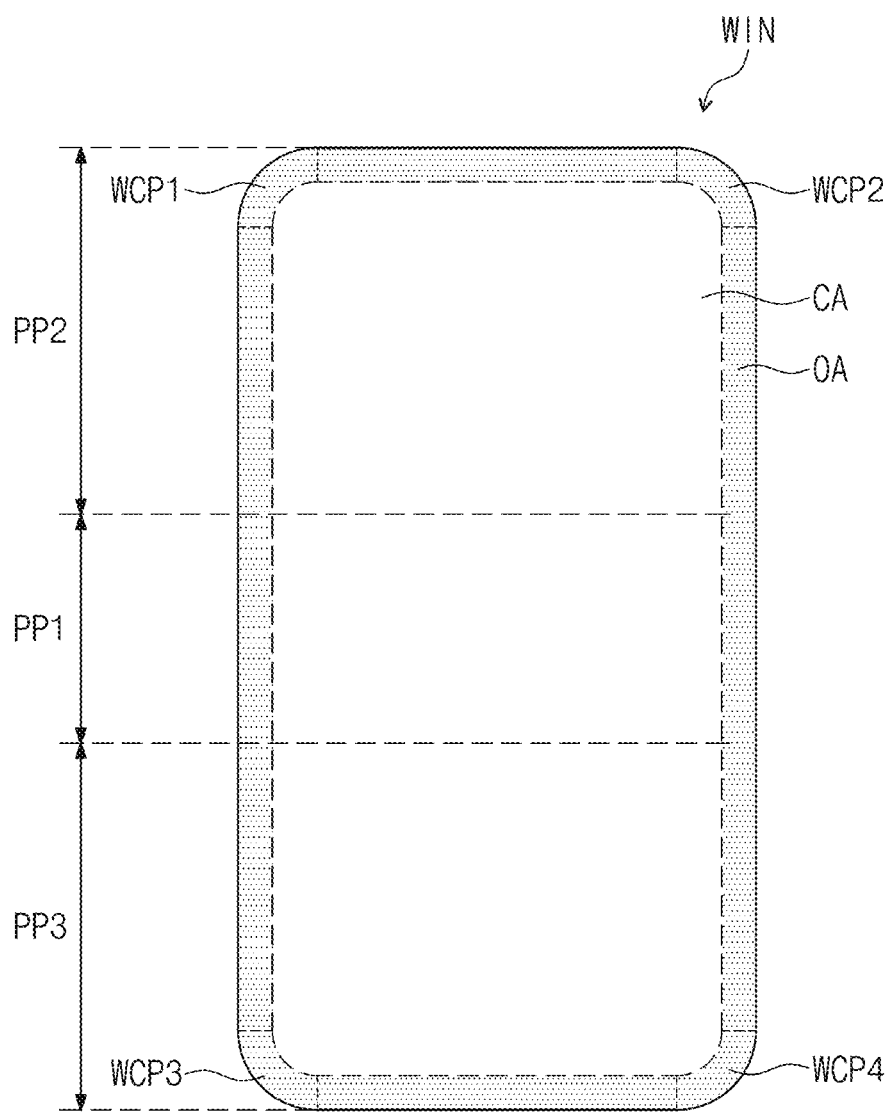
FIG. 5 is a plan view illustrating a window in FIG. 2 in an unfolded state.

FIG. 4 is a plan view illustrating the display panel in FIG. 2 in an unfolded state. FIG. 5 is a plan view illustrating the window in FIG. 2 in an unfolded state. For convenience of illustration and description, the unfolded states of the display panel DP and the window WIN are illustrated in FIGS. 4 and 5.

Referring to FIG. 4, an embodiment of the display panel DP may include a display area that displays an image and a non-display area that does not display an image. The non-display area surrounds the display area and substantially defines a bezel of the display panel DP.

In an embodiment, the folding area FA may include a first display area DA1 and a first non-display area NDA1. The first non-display area NDA1 may be disposed on each of opposing sides of the first display area DA1 with respect to the first direction DR1.

The first non-folding area NFA1 may include a second display area DA2 and a second non-display area NDA2. The second non-folding area NFA2 may include a third display area DA3 and a third non-display area NDA3.

The first to third display areas DA1 to DA3 may display an image, and the first to third non-display areas NDA1 to NDA3 may not display an image.

According to an embodiment of the invention, a first marking part MKP1 and a second marking part MKP2 may be defined in the display panel DP. The first marking part MKP1 and the second marking part MKP2 may overlap the non-display area. The first marking part MKP1 and the second marking part MKP2 may be defined on the thin-film encapsulation layer TFE in FIG. 3. However, the position at which the first and second marking parts MKP1 and MLP2 are defined in embodiments of the invention is not limited thereto.

According to an embodiment of the invention, the first marking part MKP1 may be defined in the first non-display areas NDA1 of the folding area FA. The first marking part MKP1 may include one pair of first alignment marks MK1 and at least one pair of preliminary alignment marks SMK.

The one pair of first alignment marks MK1 may be spaced apart from each other in the first direction DR1. In one embodiment, for example, with respect to the first direction DR1, one of the one pair of first alignment marks MK1 may be defined in the first non-display area NDA1 disposed at one side of the first display area DA1, and the other thereof may be defined in the first non-display area NDA1 disposed at the other side of the first display area DA1.

In an embodiment, when viewed from above the display panel DP (i.e., a plan view in the second direction DR2), the one pair of first alignment marks MK1 may overlap the folding axis FX. In such an embodiment, the folding axis FX may extend through a center of each of the one pair of first alignment marks MK1.

According to an embodiment of the invention, the preliminary alignment marks SMK may be disposed around the first alignment marks MK1. A pair of preliminary alignment marks SMK may face each other in the first direction DR1.

In an embodiment, as shown in FIG. 4, two pairs of preliminary alignment marks SMK may be defined around the one pair of first alignment marks MK1, but embodiments of the invention are not limited thereto. In one embodiment, for example, the number of the preliminary alignment marks SMK may be variously modified. In an embodiment, the first alignment marks MK1 and the preliminary alignment marks SMK have shapes shown in FIG. 4, but embodiments of the invention are not limited thereto.

According to an embodiment of the invention, the second marking part MKP2 may be defined in each of corners of the display panel DP. In one embodiment, for example, the second marking part MKP2 may include a second alignment mark MK2, a third alignment mark MK3, a fourth alignment mark MK4, and a fifth alignment mark MK5.

The second alignment mark MK2 and the third alignment mark MK3 may be defined in the second non-display area NDA2 of the first non-folding area NFA1. In an embodiment, the second alignment mark MK2 may be defined in a first corner CP1 of the second non-display area NDA2. The third alignment mark MK3 may be defined in a second corner CP2 of the second non-display area NDA2. The second alignment mark MK2 and the third alignment mark MK3 may be spaced apart from each other in the first direction DR1.

The fourth alignment mark MK4 and the fifth alignment mark MK5 may be defined in the second non-display area NDA2 of the second non-folding area NFA2. In an embodiment, the fourth alignment mark MK4 may be defined in a third corner CP3 of the third non-display area NDA3. The fifth alignment mark MK5 may be defined in a fourth corner CP4 of the third non-display area NDA3. The fourth alignment mark MK4 and the fifth alignment mark MK5 may be spaced apart from each other in the first direction DR1.

Although each of the corners of the display panel DP has a rounded shape in FIG. 4, the embodiment of the invention is not limited thereto. In one embodiment, for example, each of the corners of the display panel DP may have a sharp shape. Also, although shapes of the second to fifth alignment marks MK2 to MK5 are only exemplarily illustrated in FIG. 4, the embodiment of the invention is not limited thereto.

Referring to FIG. 5, the window WIN may include a central area CA and an edge area OA. The edge area OA may surround the central area CA. The central area CA may have a light transmittance greater than that of the edge area OA. In one embodiment, for example, the central area CA may be optically clear, and the edge area OA may be optically opaque.

In an embodiment, a first corner WCP1, a second corner WCP2, a third corner WCP3, and a fourth corner WCP4 of the edge area OA may correspond to the first to fourth corners CP1, CP2, CP3, and CP4 of the display panel DP in FIG. 4, respectively.

In an embodiment, each of the corners of the window WIN has a rounded shape as shown in FIG. 5, but not being limited thereto. In an embodiment, each of the corners of the window WIN may have a shape that is changed according to the shape of the display panel DP (refer to FIG. 4).

Figure 6:
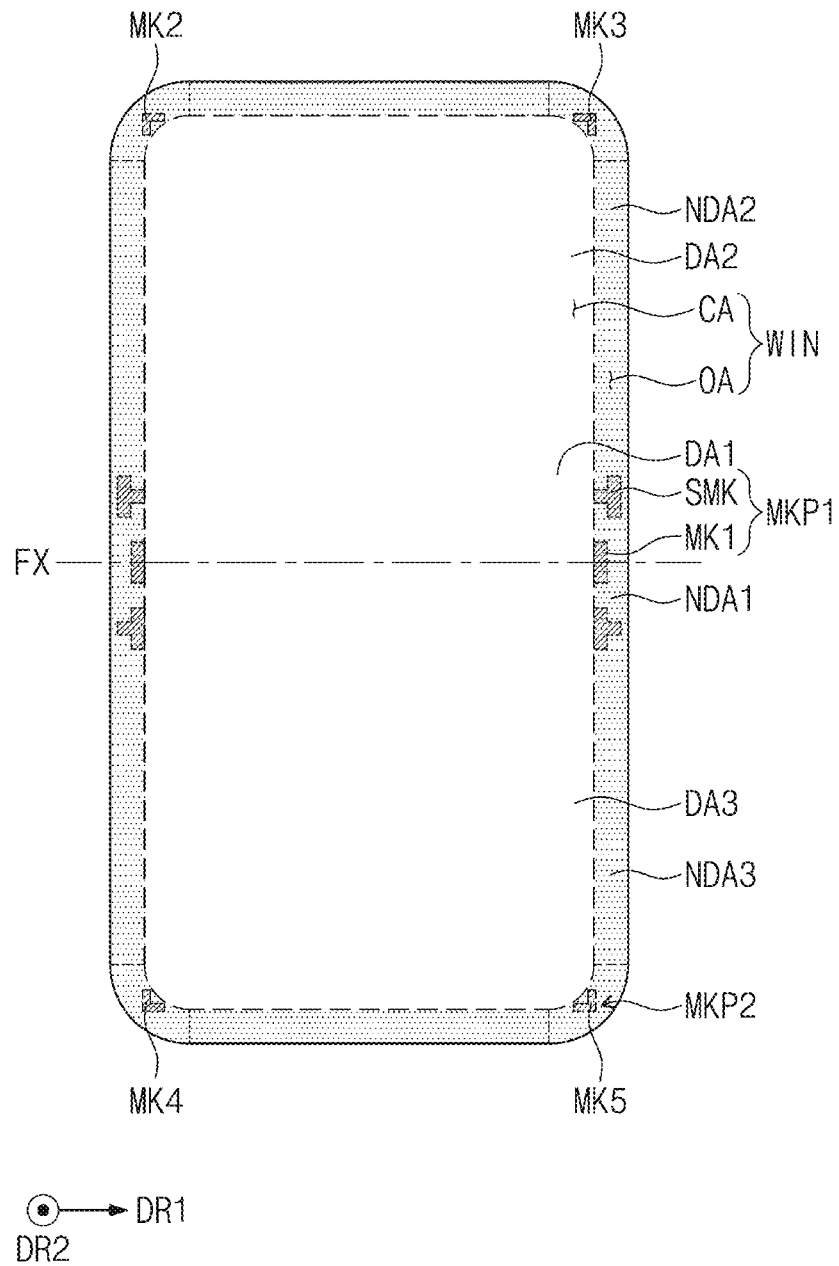
FIG. 6 is a plan view illustrating a display device in which the window in FIG. 5 is disposed on the display panel in FIG. 4.

FIG. 6 is a plan view illustrating a display device in which the window in FIG. 5 is disposed on the display panel in FIG. 4. For convenience of illustration and description, the window WIN and the display panel DP disposed below the window WIN in unfolded states are illustrated in FIG. 6.

Referring to FIGS. 4 to 6, the central area CA of the window WIN may overlap the display areas DA1 to DA3 of the display panel DP. The edge area OA of the window WIN may overlap the non-display areas NDA1 to NDA3 of the display panel DP.

Since the edge area OA is optically opaque, the first marking part MKP1 and the second marking part MKP2 defined in the non-display areas NDA1 to NDA3 may be covered by the edge area OA and may not be recognized from the outside. However, for convenience of illustration and description, each of the first marking part MKP1 and the second marking part MKP2 disposed below the edge area OA is illustrated by a dotted line in FIG. 6.

According to an embodiment of the invention, the window WIN may be further exactly arranged on the display panel DP through the first and second marking parts MKP1 and MKP2 defined in the display panel DP.

Figure 7:
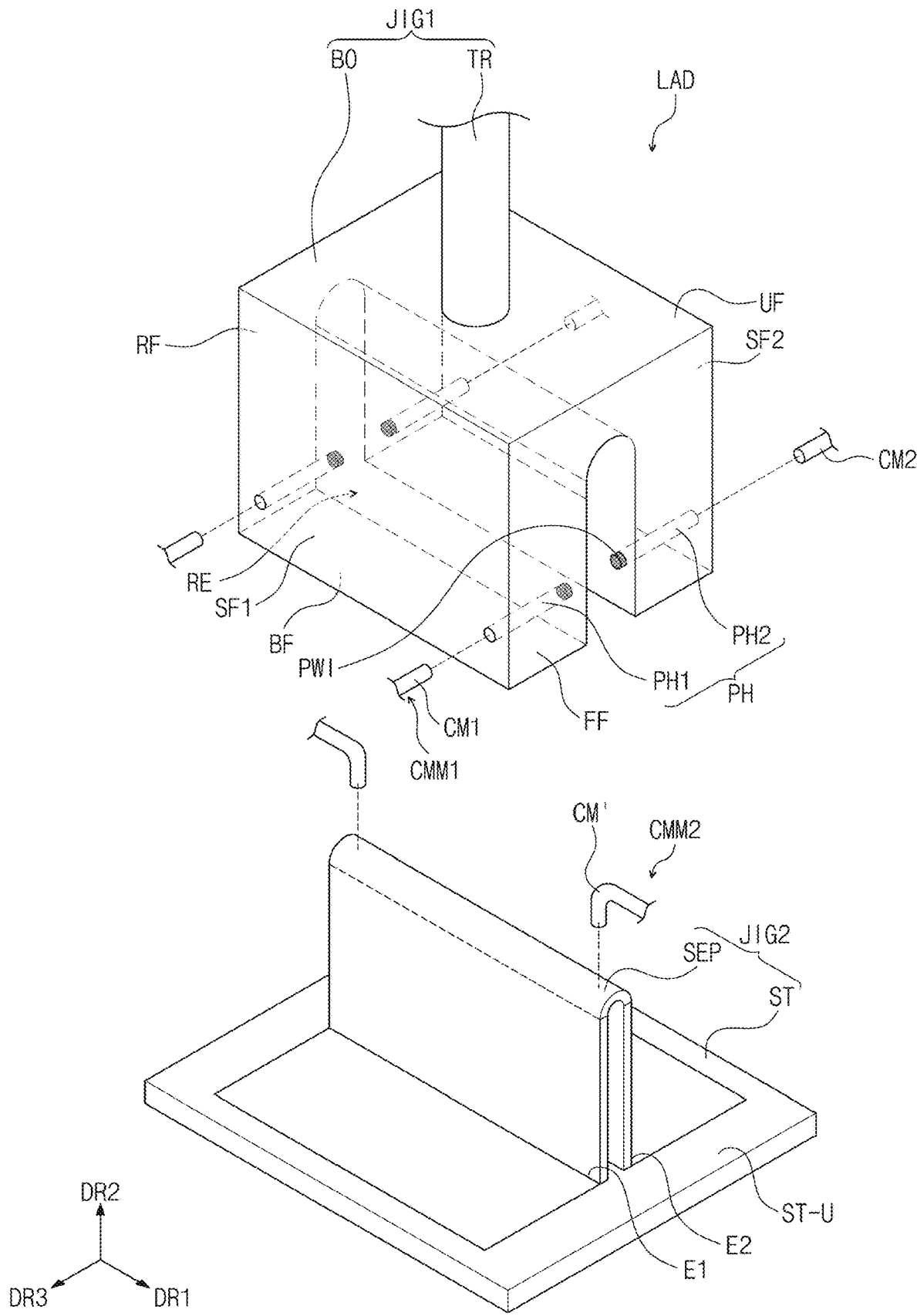
FIG. 7 is a perspective view illustrating a lamination device according to an embodiment of the invention.
Figure 8:
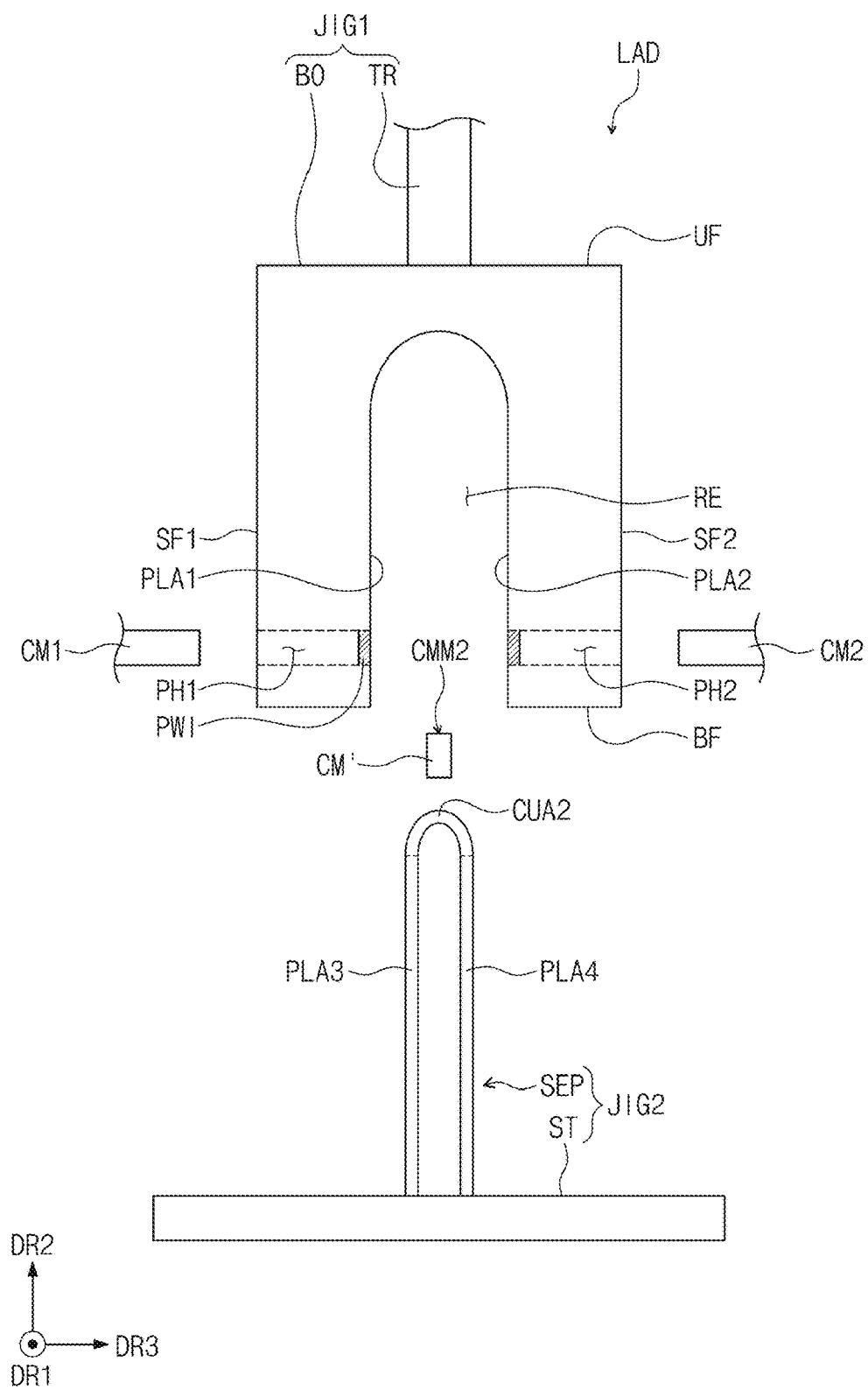
FIG. 8 is a front view illustrating the lamination device in FIG. 7.
Figure 9:
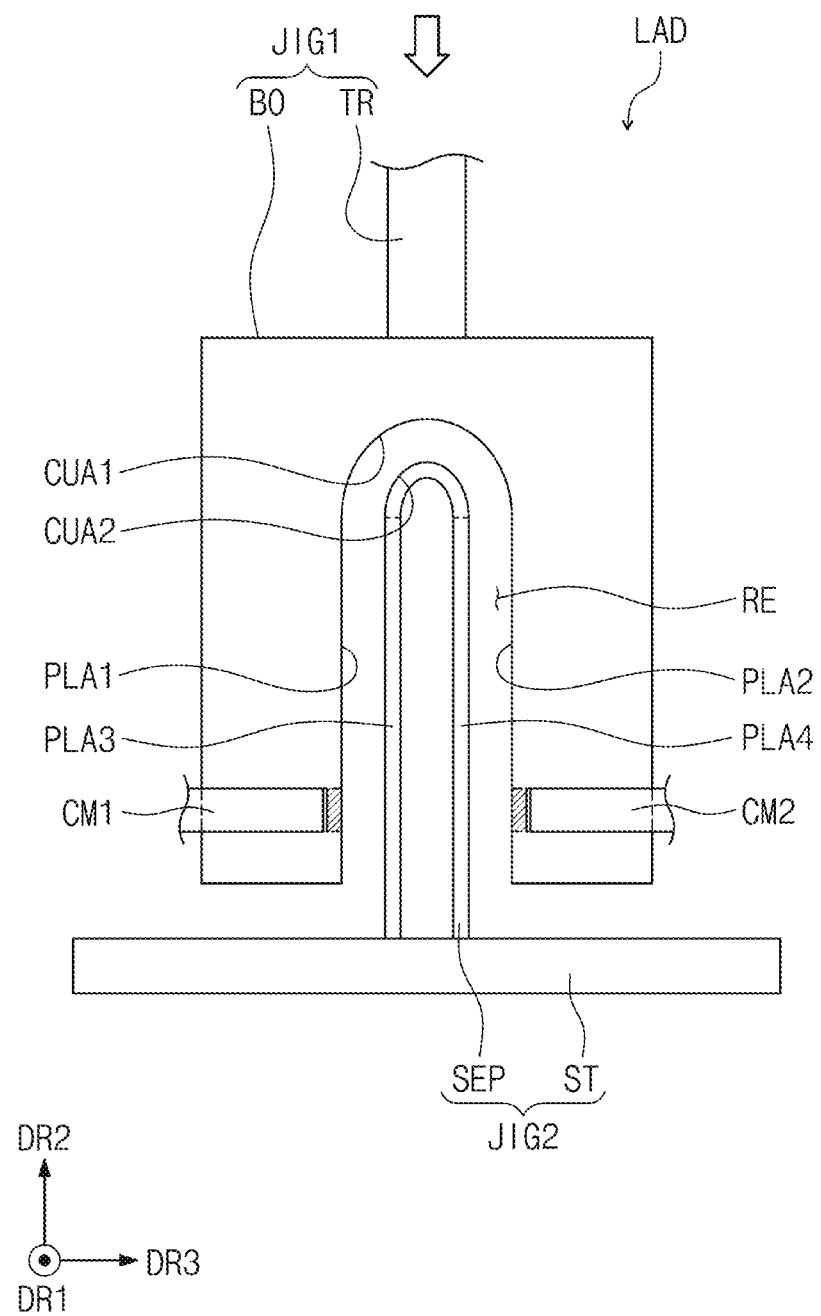
FIG. 9 is a view illustrating a state in which a first jig part and a second jig part in FIG. 8 are coupled to each other.

FIG. 7 is a perspective view exemplarily a lamination device according to an embodiment of the invention. FIG. 8 is a front view illustrating the lamination device in FIG. 7. FIG. 9 is a view illustrating a state in which a first jig and a second jig in FIG. 8 are coupled to each other.

Hereinafter, an embodiment of a manufacturing device for bonding the window WIN to the display panel DP of the display device DD will be described in detail.

Referring to FIGS. 7 to 9, an embodiment of a lamination device LAD may bond the window WIN to the display panel DP in FIG. 2. The lamination device LAD may include a first jig JIG1, a second jig JIG2 disposed below the first jig JIG1, a first camera module CMM1, and a second camera module CMM2.

The first jig JIG1 may include a main body BO and a transfer part TR. The main body BO may have an approximately rectangular shape. The transfer part TR may be connected to a top surface UF of the main body BO. The transfer part TR may move the main body BO in the first to third directions DR1, DR2, and DR3.

According to an embodiment of the invention, a recessed part RE may be defined in a bottom surface RE of the body part BO. The recessed part RE may be recessed from the bottom surface BF to the top surface UF of the main body BO. The recessed part RE may extend from a front surface FF to a rear surface RF of the main body BO in the first direction DR1. When viewed in the first direction DR1, the recessed part RE may have a reversed "U"-like shape.

In such an embodiment, the recessed part RE may be defined by a first curved area CUA1, a first flat area PLA1, and a second flat area PLA2. The first curved area CUA1 may have a shape protruding toward the top surface UF. In one embodiment, for example, the first curved area CUA1 may have a bent shape with respect to the first direction DR1. The first flat area PLA1 and the second flat area PLA2 may extend from opposing side ends of the first curved area CUA1, respectively, in the second direction DR2. The first flat area PLA1 and the second flat area PLA2 may face each other.

Each of the first flat area PLA1 and the second flat area PLA2 may be parallel to the plane defined by the first direction DR1 and the second direction DR2. The first flat area PLA1 may be parallel to a first side surface SF1 of the main body BO. The second flat area PLA2 may be parallel to a second side surface SF2 of the main body BO.

According to an embodiment of the invention, a through-hole PH may be defined in the first jig JIG1. The through-hole PH may extend from the side surface to the recessed part RE of the main body BO of the first jig JIG1. The through-hole PH may be provided in plural.

In such an embodiment, the through-hole PH may include a first through-hole PH1 and a second through-hole PH2. The first through-hole PH1 may extend from the first side surface SF1 of the main body BO to the first flat area PLA1. The first through-hole PH1 may extend in the third direction DR3. The inside of the recessed part RE may be recognized from the outside by the first through-hole PH1.

When viewed in the third direction DR3, the first through-hole PH1 may be defined in a lower portion of the first flat area PLA1. When viewed in the third direction DR3, the first through-hole PH1 may have a circular shape. However, the shape of the first through-hole PH1 in embodiments of the invention is not limited thereto.

The second through-hole PH2 may extend from the second side surface SF2 of the main body BO to the second flat area PLA2 of the recessed part RE. The second through-hole PH2 may be defined in a lower portion of the second flat area PLA2. The second through-hole PH2 may extend in the third direction DR3. When viewed in the third direction DR3, the second through-hole PH2 may have a circular shape. However, embodiments of the invention are not limited thereto.

According to an embodiment of the invention, the first through-hole PH1 and the second through-hole PH2 may overlap each other when viewed in the third direction DR3.

In an embodiment of the invention, each of the first through-hole PH1 and the second through-hole PH2 may be provided in plural. In one embodiment, for example, two first through-holes PH1 may be defined in the first side surface SF1. The first through-holes PH1 may be spaced apart from each other in the first direction DR1. Two second through-holes PH2 may be defined in the second side surface SF2. The second through-holes PH2 may be spaced apart from each other in the first direction DR1.

According to an embodiment of the invention, the main body BO may include a plurality of transmission windows PWI disposed at the through-holes PH. Each of the transmission windows PWI may be disposed at a portion adjacent to the recessed part RE in the through-hole PH. Each of the transmission windows PWI may have an optically clear property. In one embodiment, for example, each of the transmission windows PWI may include glass or plastic.

According to an embodiment of the invention, the second jig JIG2 may be disposed below the first jig JIG1. The second jig JIG2 may include a seated part SEP and a stage ST on which the seated part SEP is disposed.

The stage ST may have a board shape. In one embodiment, for example, a top surface ST-U of the stage ST may be parallel to a plane defined by the first direction DR1 and the third direction DR3.

The seated part SEP may be disposed on the top surface ST-U of the stage ST. The seated part SEP may have a shape corresponding to the recessed part RE. In one embodiment, for example, the seated part SEP may include a second curved area CUA2, a third flat area PLA3, and a fourth flat area PLA4.

The second curved area CUA2 may be folded or foldable with respect to the first direction DR1. With respect to the third direction DR3, the second curved area CUA2 may have the first curved area CUA1. The second curved area CUA2 may have a shape that is deformed by the third flat area PLA3, and the fourth flat area PLA4, which will be described later.

The third flat area PLA3 and the fourth flat area PLA4 may extend from opposing side ends of the second curved area CUA2, respectively, in the second direction DR2. Each of the third flat area PLA3 and the fourth flat area PLA4 may be parallel to the plane defined by the first direction DR1 and the second direction DR2.

A first end E1 of the third flat area PLA3 and a second end E2 of the fourth flat area PLA4 may be connected to the top surface ST-U of the stage ST. The first end E1 and the second end E2 may be movable on the top surface ST-U of the stage ST in the third direction DR3.

In an embodiment, as illustrated in FIGS. 7 and 8, when the first end E1 and the second end E2 are disposed at a central portion of the top surface ST-U of the stage ST in the third direction DR3, each of the third flat area PLA3 and the fourth flat area PLA4 may be parallel to the plane defined by the first direction DR1 and the second direction DR2, and the second curved area CUA2 may be folded.

When each of the first end E1 and the second end E2 is moved and disposed around an end of the top surface ST-U of the stage ST in the third direction DR3, the seated part SEP may be in an unfolded shape such that each of the third flat area PLA3 and the fourth flat area PLA4 may be parallel to the plane defined by the first direction DR1 and the third direction DR3, and the second curved area CUA2 may be parallel to each of the third flat area PLA3 and the fourth flat area PLA4.

According to an embodiment of the invention, the camera module CMM may include a first camera module CMM1 and a second camera module CMM2. Each of the first camera module CMM1 and a second camera module CMM2 may be moved or movable in the first to third directions DR1, DR2, and DR3.

The first camera module CMM1 may include a first camera CM1 and a second camera CM2, which are disposed adjacent to the first jig JIG1. The first and second cameras CM1 and CM2 may be disposed adjacent to the side surfaces SF1 and SF2 of the first jig JIG1, respectively. The first camera CM1 may be provided in plural, and the second camera CM2 may be provided in plural.

Each of the first and second cameras CM1 and CM2 may be disposed at the corresponding through-hole PH of the first jig JIG1. In an embodiment, the first and second cameras CM1 and CM2 may be moved into the first and second through-holes PH1 and PH2, respectively. The first and second cameras CM1 and CM2 may photograph the inside of the recessed part RE through the transmission windows PWI.

The second camera module CMM2 may be disposed on the seated part SEP of the second jig JIG2. When viewed in the second direction DR2, the second camera module CMM2 may overlap the second curved area CUA2 of the seated part SEP. The second camera module CMM2 may photograph the second curved area CUA2.

In one embodiment, for example, the second camera module CMM2 may include two cameras CM'. The cameras CM' may be disposed on opposing side ends of the second curved area CUA2 in the first direction DR1. The cameras CM' may photograph the opposing side ends of the second curved area CUA2.

Referring to FIG. 9, the first jig JIG1 may be coupled to the second jig JIG2. In one embodiment, for example, the transfer part TR of the first jig JIG1 may move the main body BO in the second direction DR2. The seated part SEP of the second jig JIG2 may be disposed inside the recessed part RE of the first jig JIG1.

With respect to the second direction DR2, the first curved area CUA1 and the second curved area CUA2 may face each other. With respect to the third direction DR3, the first flat area PLA1 and the third flat area PLA3 may face each other. The second flat area PLA2 and the fourth flat area PLA4 may face each other.

A predetermined space may be defined between inside surfaces (i.e., the first curved area CUA1 and the first and second flat areas PLA1 and PLA2) defining the recessed part RE and an outside surface of the seated part SEP.

According to an embodiment of the invention, the window WIN in FIG. 2 may be disposed in the recessed part RE. The window WIN in FIG. 2 may be photographed by the first camera module CMM1 disposed at the through-hole PH. In such an embodiment, the first and second cameras CM1 and CM2 may photograph the first to fourth corners WCP1 to WCP4 (refer to FIG. 5) of the window WIN through the first and second through-holes PH1 and PH2.

Thus, in such an embodiment, the window WIN may be allowed to be arranged at an exact position on the recessed part RE of the first jig JIG1 through the through-hole PH and the first camera module CMM1 disposed at the through-hole PH.

According to an embodiment of the invention, the display panel DP in FIG. 2 may be disposed on the seated part SEP. Accordingly, in such an embodiment, the display panel DP may be allowed to be arranged at a preset position on the seated part SEP through the second camera module CMM2. Thus, a process of folding the display panel DP, which will be described later, may be further exactly performed.

Figure 10:
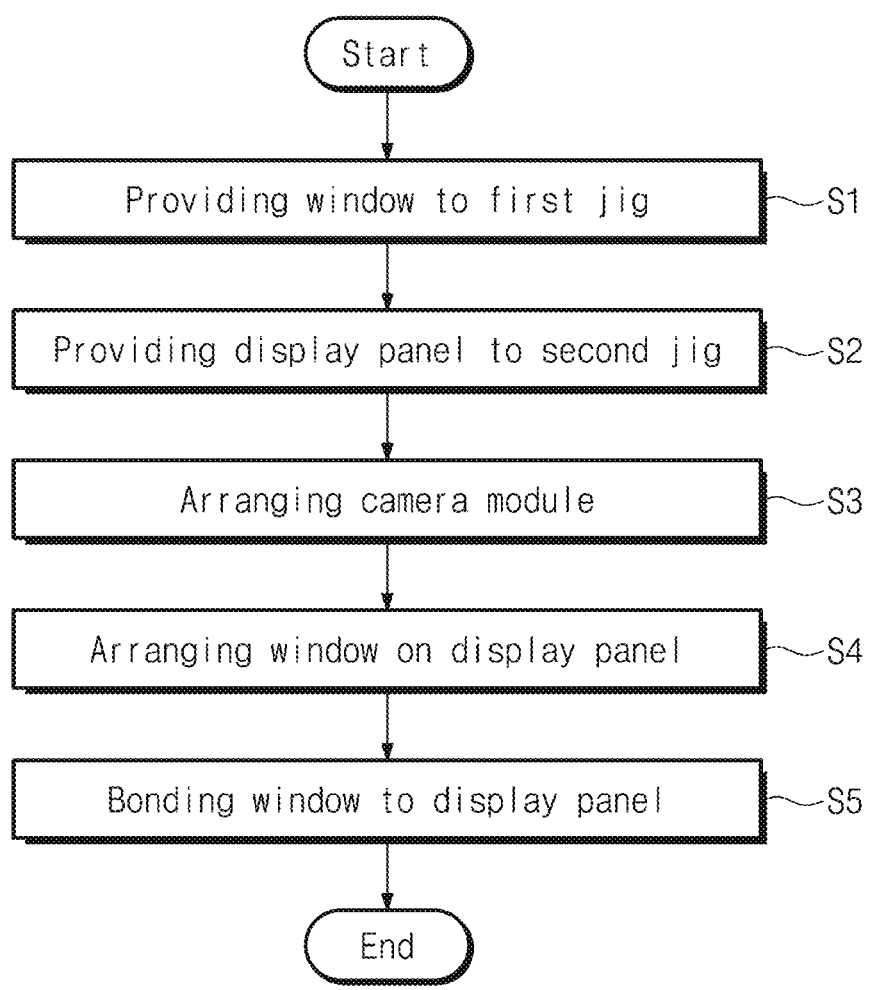
FIG. 10 is a flowchart illustrating a method for manufacturing the display device according to an embodiment of the invention.

FIG. 10 is a flowchart representing a method for manufacturing the display device according to an embodiment of the invention. FIGS. 11 to 21 are views illustrating processes of the method for manufacturing the display device described in FIG. 10.

Figure 11:
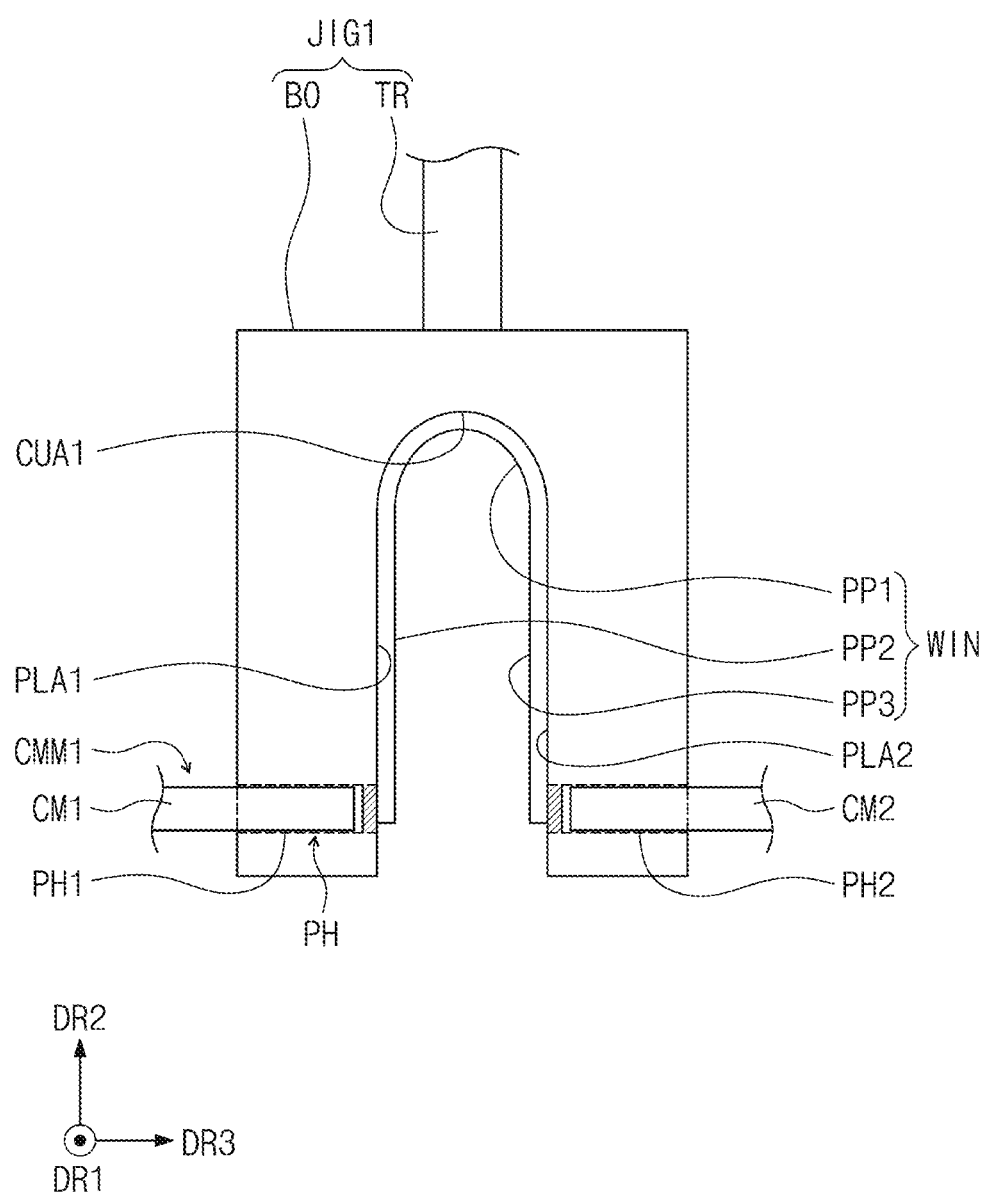
Figure 12:
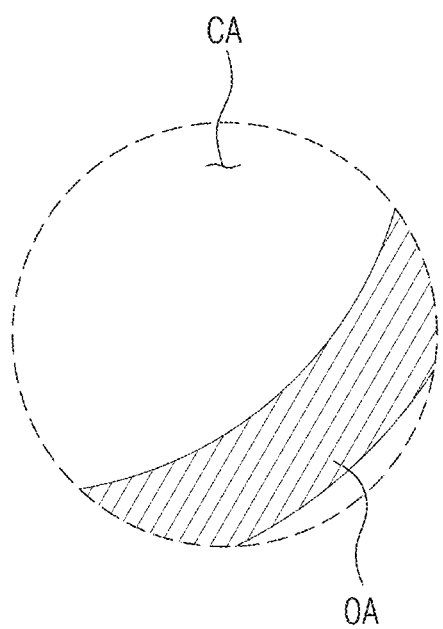

FIG. 11 is a view illustrating a state in which the window WIN is provided to the first jig JIG1, and FIG. 12 is a view illustrating a portion of the window WIN photographed by the first camera CM1 in FIG. 11. Particularly, FIG. 12 illustrates a photographed portion around the first corner WCP1 of the window WIN in FIG. 5.

Hereinafter, an embodiment of the method for manufacturing the display device through the lamination device will be described with reference to FIGS. 10 to 19.

Referring to FIGS. 7 and 10 to 12, in a process S1, the window WIN is provided to the first jig JIG1. In an embodiment, the window WIN may be provided inside the recessed part RE. The first portion PP1 of the window WIN may be disposed on the first curved area CUA1, and the second portion PP2 and the third portion PP3 may be disposed on the first flat area PLA1 and the second flat area PLA2, respectively.

The process S1 may include a process of adjusting a position of the window WIN through the first and second through-holes PH1 and PH2 defined in the first jig JIG1 until a boundary between the edge area OA and the central area CA of the window WIN is photographed by the first camera module CMM1.

In one embodiment, for example, referring to FIG. 12, the corner of the window WIN may be photographed by the first camera CM1. In such an embodiment, the position of the window WIN may be adjusted until the boundary between the edge area OA and the central area CA of the window WIN is photographed by the first camera CM1.

The position of the window WIN may be adjusted so that the central area CA around the corner of the window WIN and the edge area OA disposed adjacent to the central area CA are photographed by the first camera CM1 disposed in the rest one first through-hole PH1 (refer to FIG. 7) and the second cameras CM2 disposed in the two second through-holes PH2 when the edge area OA and the central area CA of the corner of the window WIN is photographed by the first camera CM1 disposed in the first through-hole PH1.

According to an embodiment of the invention, the position of the window WIN may be exactly arranged in the recessed part RE through the first camera module CMM1 disposed in the through-holes PH.

Figure 13:
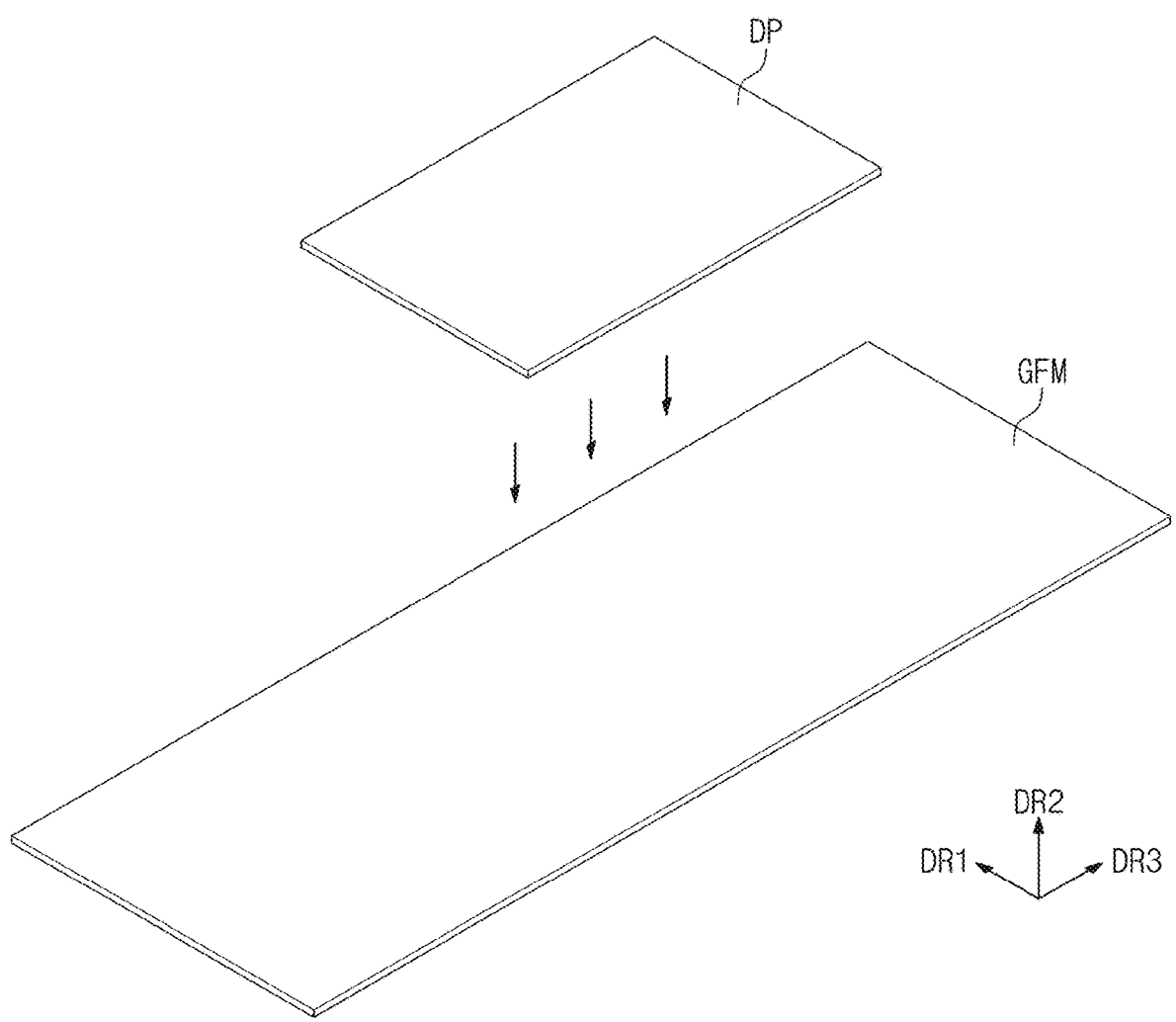

FIG. 13 is a view illustrating the display panel to be bonded to the window and a guide film disposed below the display panel.

Referring to FIG. 13, a guide film GFM may have a length greater than that of the display panel DP in the third direction DR3. The display panel DP may be disposed on the guide film GFM and bonded to the guide film GFM. A process of bonding the guide film GFM and the display panel DP may be performed in a first process chamber (not shown). Although not shown, an adhesive for bonding the display panel DP to the guide film GFM may be further used.

The guide film GFM and the display panel DP, which are bonded to each other, may be transferred to a second process chamber (not shown). In the second process chamber, a process of bonding the window WIN to the display panel DP may be performed. The above-described lamination device LAD may be disposed in the second process chamber.

Figure 14:
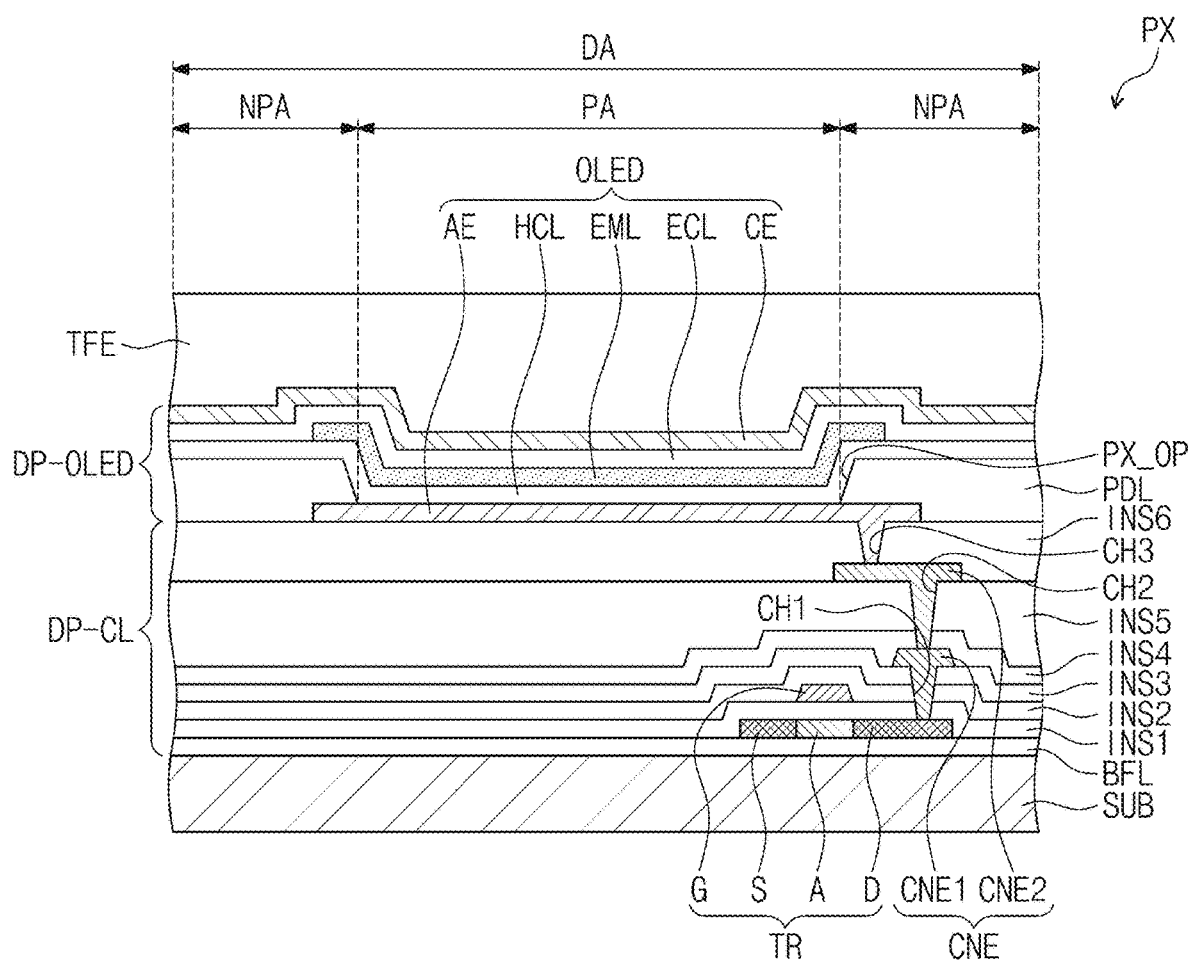

FIG. 14 is a view illustrating a constitution of a pixel disposed in the display panel in FIG. 13.

Referring to FIGS. 13 and 14, an embodiment of the display panel DP may include a plurality of pixels PX, and each of the pixels PX may include a transistor TR and a light emitting device OLED. The light emitting device OLED may include a first electrode AE, a second electrode CE, a hole control layer HCL, an electron control layer ECL, and a light emitting layer EML. In an embodiment, the first electrode AE may be an anode electrode, and the second electrode CE may be a cathode electrode.

The transistor TR and the light emitting device OLED may be disposed on a substrate SUB. FIG. 14 shows only one transistor TR of the pixel PX, but the pixel PX may substantially include a plurality of transistors for driving the light emitting device OLED and at least one capacitor. The display area DA may include a light emitting area PA, in which the light emitting device OLED is disposed, and a non-light emitting area NPA disposed around the light emitting area PA.

A buffer layer BFL may be disposed on the substrate SUB. The buffer layer BFL may be an inorganic layer. A semiconductor pattern may be disposed on the buffer layer BFL. In an embodiment, the semiconductor pattern may include a polysilicon. However, the embodiment of the invention is not limited thereto. In one alternative embodiment, for example, the semiconductor pattern may include amorphous silicon or a metal oxide.

The semiconductor pattern may be doped with an n-type dopant or a p-type dopant. The semiconductor pattern may include a highly doped area and a lightly doped area. The highly doped area may have a conductivity greater than that of the lightly doped area. In such an embodiment, the highly doped area may serve as a source electrode and a drain electrode of the transistor TR. The lightly doped area may substantially correspond to an active (or a channel) of the transistor.

A source SC1, an active A1, and a drain D1 of the transistor TR may be provided from the semiconductor pattern. A first insulation layer INS1 may be disposed on the semiconductor pattern. A gate G of the transistor TR may be disposed on the first insulation layer INS1.

A second insulation layer INS2 may be disposed on the gate G. A third insulation layer INS3 may be disposed on the second insulation layer INS2. A connection electrode CNE for connecting the transistor TR and the light emitting device OLED may be disposed between the transistor TR and the light emitting device OLED. The connection electrode CNE may include a first connection electrode CNE1 and a second connection electrode CNE2 disposed on the first connection electrode CNE1.

The first connection electrode CNE1 may be disposed on the third insulation layer INS3 and connected to the drain D through a first contact hole CH1 defined in the first to third insulation layer INS1 to INS3. A fourth insulation layer INS4 may be disposed on the first connection electrode CNE1. A fifth insulation layer INS5 may be disposed on the fourth insulation layer INS4. A second connection electrode CNE2 may be disposed on the fifth insulation layer INS5. The second connection electrode CNE2 may be connected to the first connection electrode CNE1 through a second contact hole CH2 defined in the fifth insulation layer INS5.

A sixth insulation layer INS6 may be disposed on the second connection electrode CNE2. Layers from the buffer layer BFL to the sixth insulation layer INS6 may be defined as a circuit device layer DP-CL. Each of the first to sixth insulation layer INS1 to INS6 may be an inorganic layer or an organic layer.

A first electrode AE may be disposed on the sixth insulation layer INS6. The first electrode AE may be connected to the second connection electrode CNE2 through a third contact hole CH3 defined in the sixth insulation layer INS6. A pixel defining layer PDL may be disposed on the first electrode AE and the sixth insulation layer INS6. An opening PX-OP for exposing a predetermined portion of the first electrode AE may be defined in the pixel defining layer PDL.

The hole control layer HCL may be disposed on the first electrode AE and the pixel defining layer PDL. The hole control layer HCL may be disposed on the light emitting area PA and the non-light emitting area NPA in common. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate one of red light, green light, and blue light.

The electron control layer ECL may be disposed on the light emitting layer EML and the hole control layer HCL. The electron control layer ECL may be disposed on the light emitting area PA and the non-light emitting area NPA in common. The electron control layer ECL may include an electron transport layer and an electron injection layer.

The second electrode CE may be disposed on the electron control layer ECL. The second electrode CE may be disposed on the pixels in common. The thin-film encapsulation layer TFE may be disposed on the light emitting device OLED. A layer in which the light emitting device OLED is disposed may be defined as a display device layer DP-OLED.

A first voltage may be applied to the first electrode AE through the transistor TR, and a second voltage may be applied to the second electrode CE. When the first and second voltages are applied to the first and second electrodes AE and CE, a hole and an electron, which are injected to the light emitting layer EML, may be coupled to provide an exciton, and, while the exciton is transferred to the ground state, the light emitting device OLED may emit light.

Figure 16:
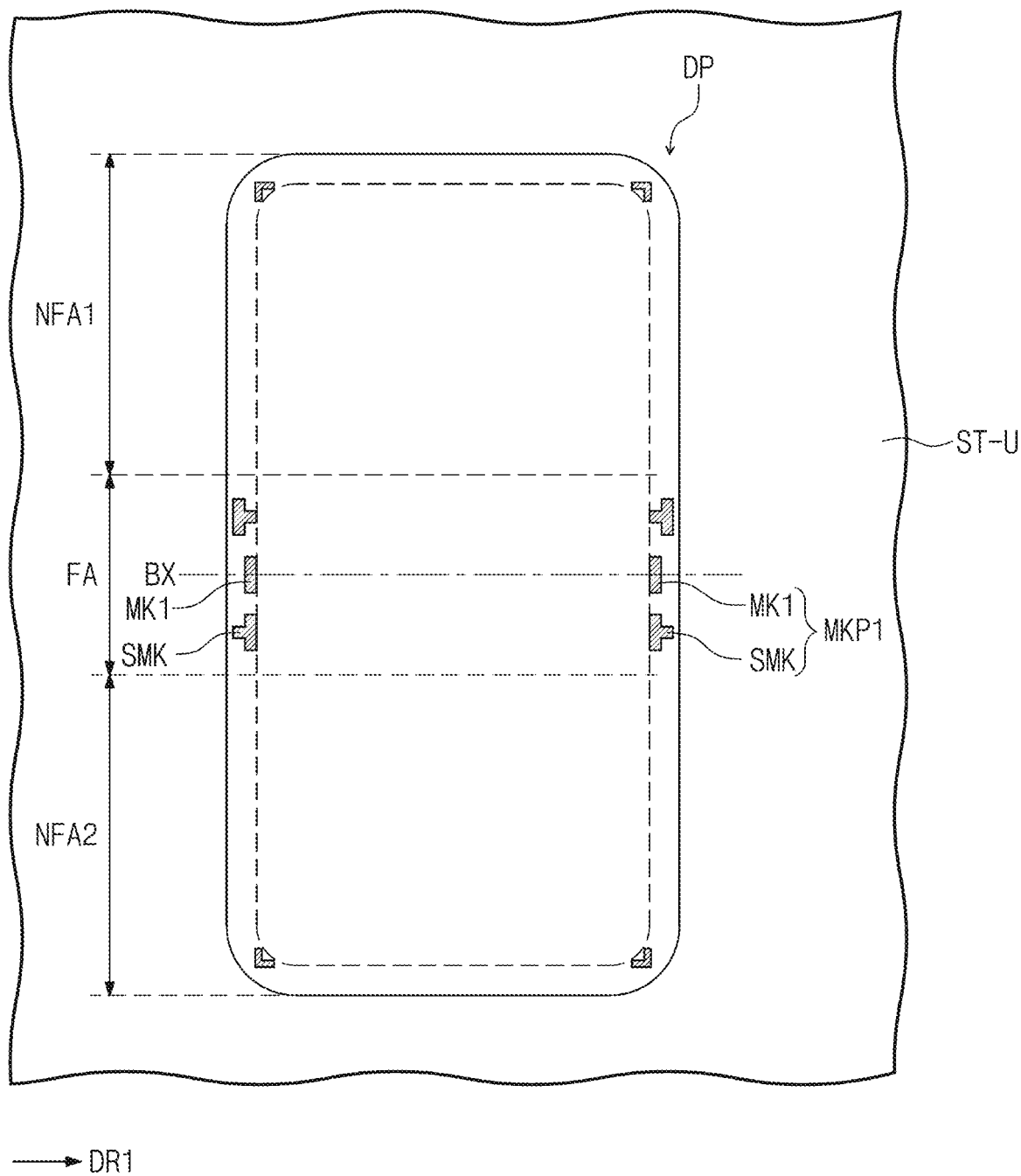
Figure 17:
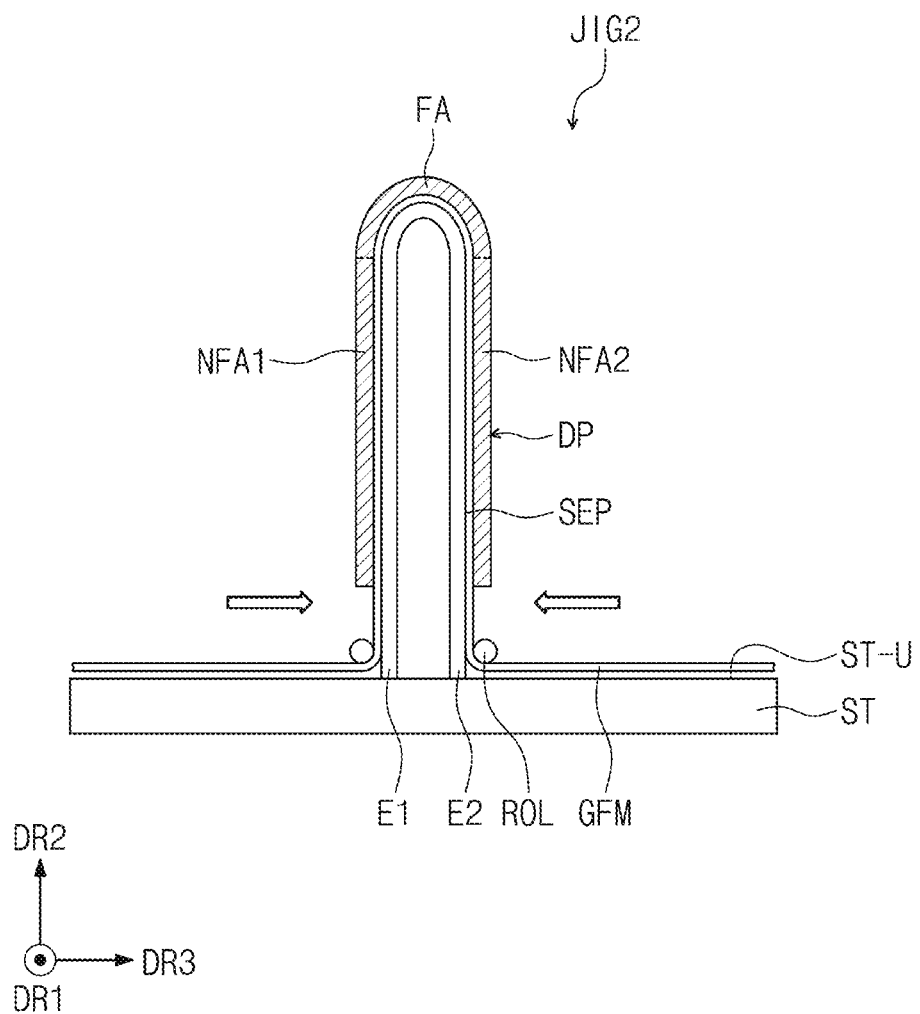

FIG. 15 is a view illustrating a state in which the display panel DP before being folded is disposed on the second jig JIG2. FIG. 16 is a view illustrating a state in which the display panel DP in FIG. 13 is photographed by the second camera module CMM2. FIG. 17 is a view illustrating the display panel DP in FIG. 15 in a folded state.

Referring to FIGS. 10 and 15 to 17, in a process S2, the display panel DP may be provided on the seated part SEP of the second jig JIG2. The process S2 may include a process of folding the display panel DP on the second jig JIG2 in an unfolded state.

In such an embodiment, as illustrated in FIG. 15, in the process S2, the display panel DP in the unfolded state may be disposed on the seated part SEP through the guide film GFM. The guide film GFM may be disposed on the seated part SEP, and the display panel DP may be disposed on the guide film GFM.

A top surface of the seated part SEP may be parallel to the plane defined by the first direction DR1 and the second direction DR2. In such an embodiment, when each of the first end E1 and the second end E2 is disposed around the end of the top surface ST-U of the stage ST, the third flat area PLA3, the second curved area CUA2, and the fourth flat area PLA4 of the seated part SEP may be parallel to the plane defined by the first direction DR1 and the third direction DR3.

Each of the folding area FA, the first non-folding area NFA1, and the second non-folding area NFA2 of the unfolded display panel DP disposed on the seated part SEP may be disposed parallel to the top surface of the seated part SEP.

Guide rollers ROL may be disposed on the guide film GFM. The display panel DP may be disposed between the rollers ROL.

In such an embodiment, as illustrated in FIG. 16, in the process S2, the position of the display panel DP may be adjusted by using the second camera module CMM2 so that the first alignment mark MK1 overlaps a bending axis BX. When the first alignment mark MK1 is hardly distinguished, the position of the display panel DP may be compensated through the preliminary alignment marks SMK disposed around the first alignment mark MK1.

Referring to FIG. 17, in the process S2, the display panel DP may be folded. In such an embodiment, when the first end E1 of the third flat area PLA3 and the second end E2 of the fourth flat area PLA4 are moved to the central portion of the top surface ST-U of the stage ST, the folding area FA of the display panel DP is folded, and the first non-folding area NFA1 and the second non-folding area NFA2 may face each other in the third direction DR3.

The guide rollers ROL may be also moved to be adjacent to each other in the third direction DR3. As the guide rollers ROL are moved, the guide film GFM may be also moved in conjunction with the seated part SEP. As the guide rollers ROL are moved, portions of the guide film GFM, which are adjacent to the first and second non-folding areas NFA1 and NFA2, may be moved to be adjacent to each other.

The guide rollers ROL may be disposed below ends of the first and second non-folding areas NFA1 and NFA2, respectively. The guide rollers ROL may guide the guide film GFM to stably arrange the guide film GFM on the seated part. According to an embodiment of the invention, the process S1 and the process S2 may be performed at the same time. However, the embodiment of the invention is not limited thereto. In one alternative embodiment, for example, the process S1 may be performed, and then the process S2 may be performed.

Figure 18:
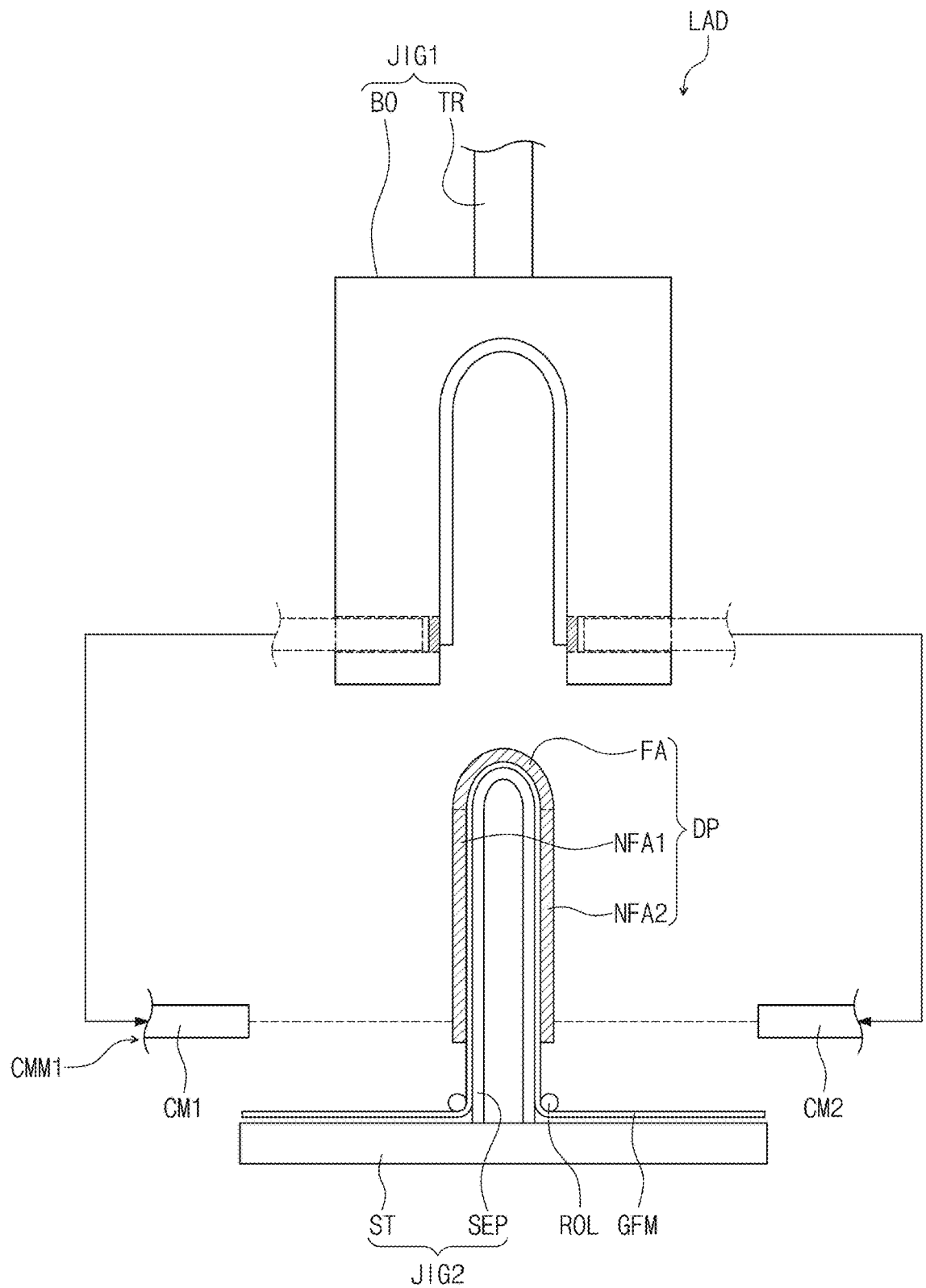
Figure 19:
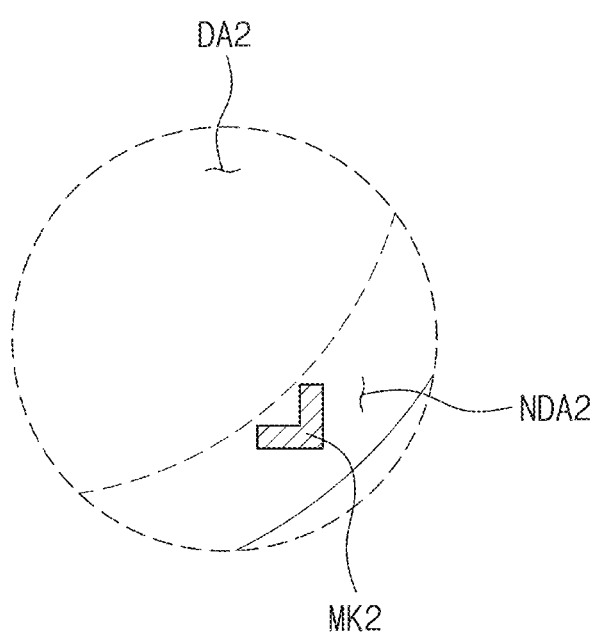

FIG. 18 is a view illustrating a state in which the first camera module CMM1 in FIG. 11 is moved. FIG. 19 is a view illustrating a portion of the display panel DP photographed by the first camera CM1 in FIG. 18. Particularly, FIG. 19 is a view illustrating a photographed state of the first corner CP1 of the display panel DP in FIG. 4.

Referring to FIGS. 7, 10, and 18, in a process S3, the first camera module CMM1 may be moved from the first jig JIG1 to around the second jig JIG2 and photograph the display panel DP. In such an embodiment, the first cameras CM1 and the second cameras CM2 may be moved to photograph the corners of the display panel DP. The first cameras CM1 and the second cameras CM2 may photograph the second marking part MKP2 in FIG. 4.

In such an embodiment, as illustrated in FIG. 19, the first camera CM1 disposed in the first through-hole PH1 may photograph the second alignment mark MK2 defined in the first non-display area NDA2, the second display area NDA2, and the second display area DA2 of the corners of the display panel DP. Although not shown, the third to fifth alignment marks MK3 to MK5 may be photographed by the rest first camera CM1 and the second cameras CM2. Thus, the second marking part MKP2 in FIG. 4 may be recognized by the first and second cameras CM1 and CM2.

Figure 20:
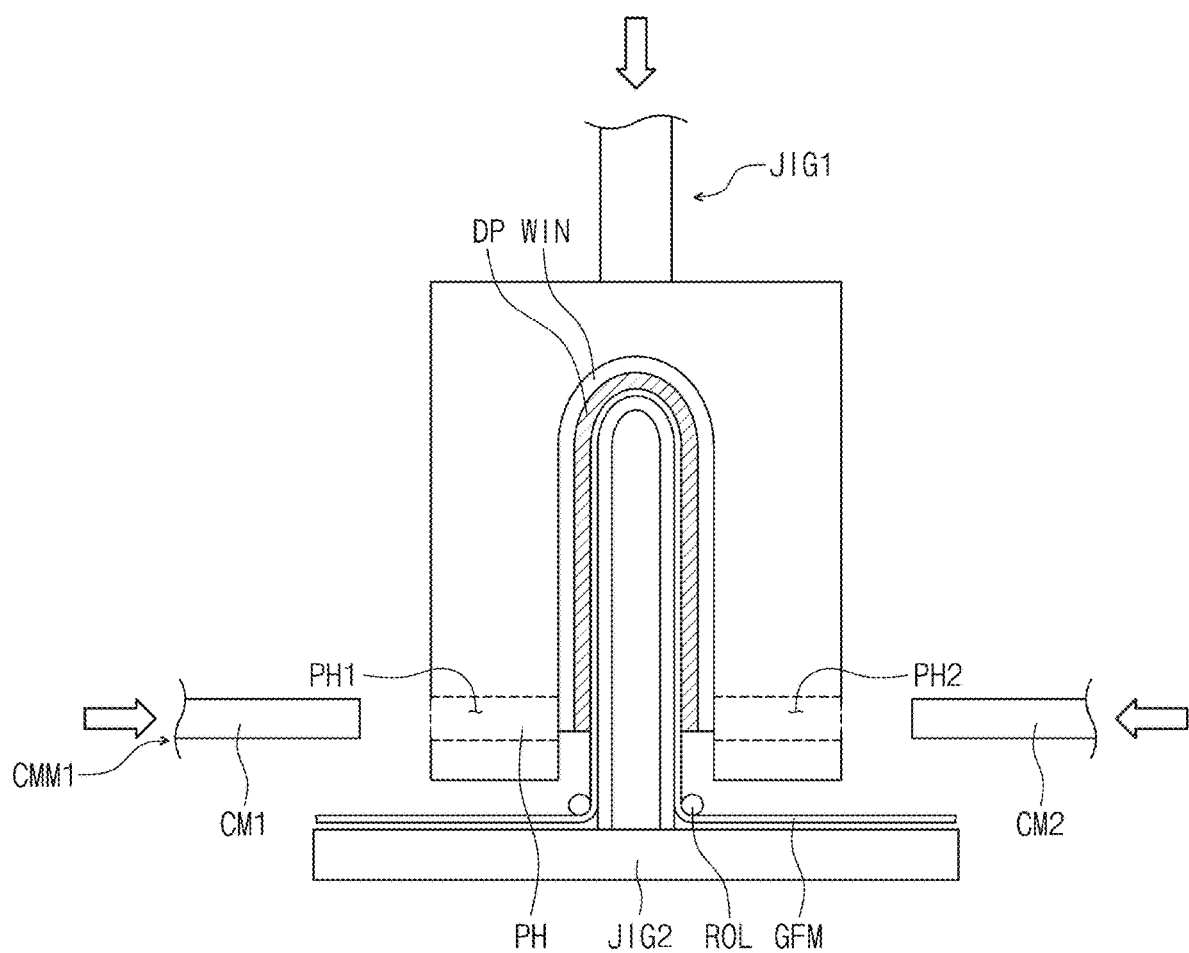
Figure 21:
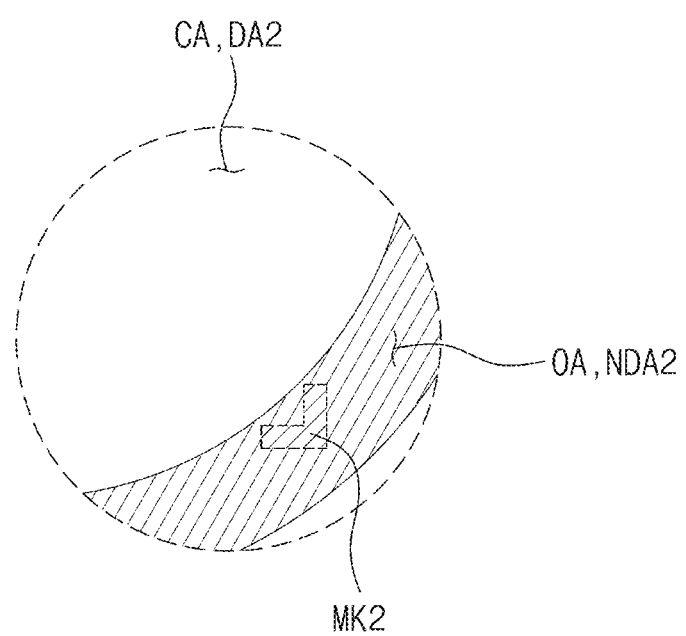

FIG. 20 is a view illustrating a state in which the first jig JIG1 and the second jig JIG2 in FIG. 18 are coupled. FIG. 21 is a view illustrating the corner of the window WIN photographed by the first camera CM1 in FIG. 20. Particularly, FIG. 21 and FIG. 19 are photographed at a same position.

Referring to FIGS. 7, 10, 20, and 21, in a process S4, the window WIN may be disposed on the display panel DP. In such an embodiment, the first jig JIG1 may descend and be coupled to the second jig JIG2. Thus, the window WIN disposed in the first jig JIG1 may be disposed on the display panel DP disposed on the second jig JIG2.

The adhesive layer ADL in FIG. 3 may be disposed on the top surface of the display panel DP disposed on the second jig JIG2. However, the embodiment of the invention is not limited thereto. In one alternative embodiment, for example, the adhesive layer ADL may be disposed on the bottom surface of the window WIN disposed on the first jig JIG1.

In such an embodiment, an alignment state between the window WIN and the display panel DP may be checked through the first and second cameras CM1 and CM2. In one embodiment, for example, the first and second cameras CM1 and CM2 may be moved into the corresponding first and second through-holes PH1 and PH2, respectively, and photograph the corners of the window WIN.

In the process S4, the position of the window WIN may be adjusted until the edge area OA of the window WIN overlaps the second alignment mark MK2 of the display panel DP. In an embodiment, as illustrated in FIG. 21, when the edge area OA of the window WIN covers the second alignment mark MK2 recognized by the first and second cameras CM1 and CM2 and overlaps the second non-display area NDA2 of the display panel DP, it may be confirmed that the window WIN is exactly arranged at the preset position of the display panel DP.

Although not shown, the position of the window WIN may be adjusted by checking whether the edge area OA of the window WIN overlaps the third to fifth alignment marks MK3 to MK5 through the rest first camera CM1 and the second cameras CM2.

According to an embodiment of the invention, in a process S5, the window WIN may be bonded to the display panel DP. In one embodiment, for example, the process S5 may perform a process of curing the adhesive layer ADL in FIG. 4 in a state in which the window WIN and the display panel DP are exactly arranged with each other.

As a result, an embodiment of the lamination device LAD according to f the invention may align the window in a folded state to the display panel in a folded state at an exact position and then bond the window and the display panel to each other.

Figure 22:
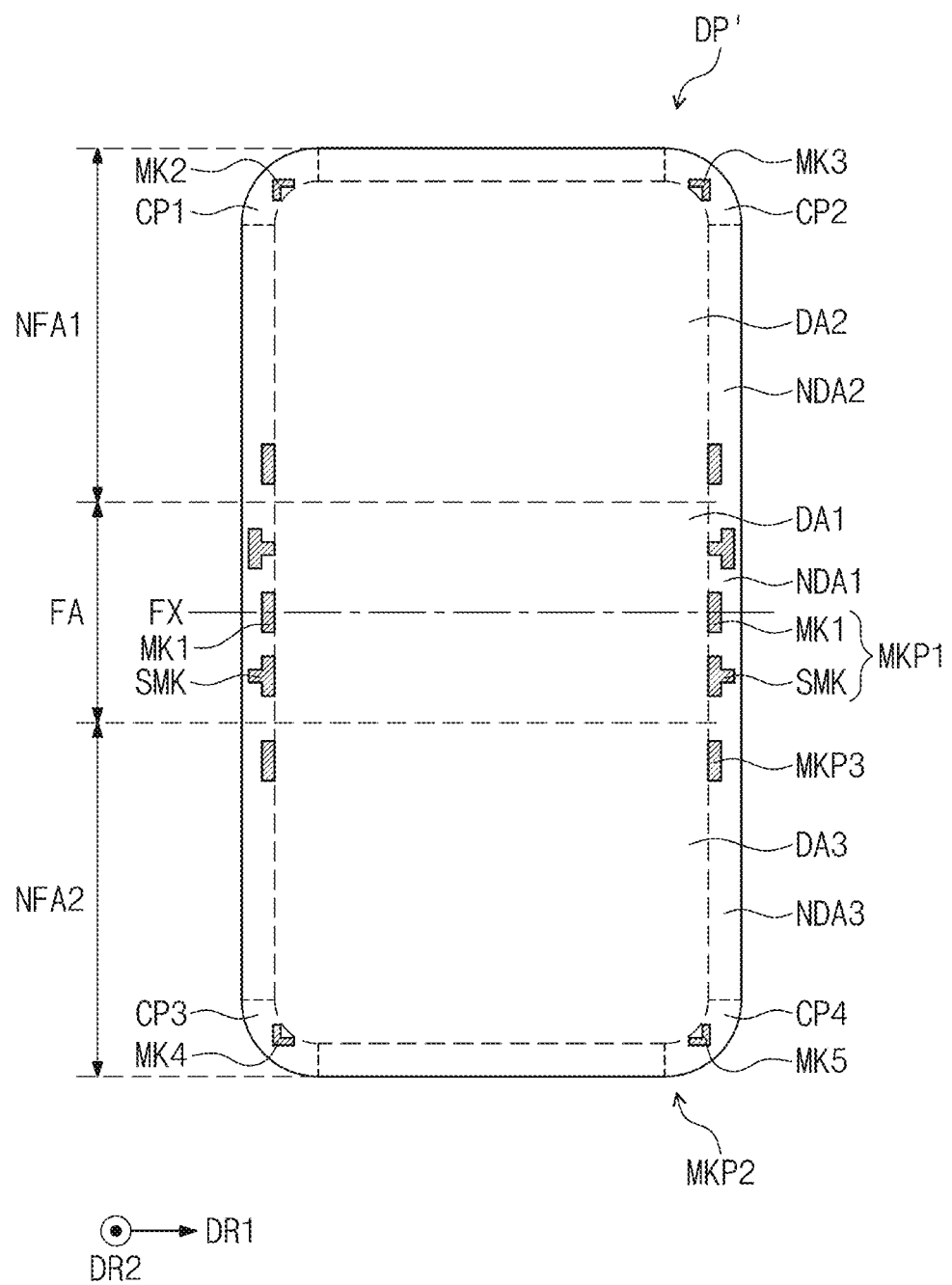
FIG. 22 is a view illustrating a constitution of a display panel according to an alternative embodiment of the invention.

FIG. 22 is a view illustrating a constitution of a display panel according to an alternative embodiment of the invention.

FIG. 22 illustrates a plan view corresponding to FIG. 4. The same or like elements shown in FIG. 22 have been labeled with the same reference characters as used above to describe the embodiment of the display panel shown in FIG. 4, and any repetitive detailed description thereof will hereinafter be omitted or simplified Referring to FIG. 22, in an embodiment, a first marking part MKP1 and a second marking part MKP2 may be defined in the display panel DP'. The first marking part MKP1 and a second marking part MKP2 may be substantially the same as those described above with reference to FIG. 4.

In such an embodiment, a third marking part MKP3 may be further defined in the display panel DP'. The third marking part MKP3 may be defined in a second non-display area NDA2 of a first non-folding area NFA1 and a third non-display area NDA3 of a second non-folding area NFA2. The third marking part MKP3 may be disposed adjacent to a folding area FA. In one embodiment, for example, the third marking part MKP3 may be defined around a boundary between the folding area FA and the first non-folding area NFA1 and around a boundary between the folding area FA and the second non-folding area NFA2.

In an embodiment, two pairs of third marking parts MKP3 facing each other in the first direction DR1 is provided as shown in FIG. 22, but the number and shape of the third marking parts MKP3 in embodiments of the invention is not limited thereto.

Figure 23:
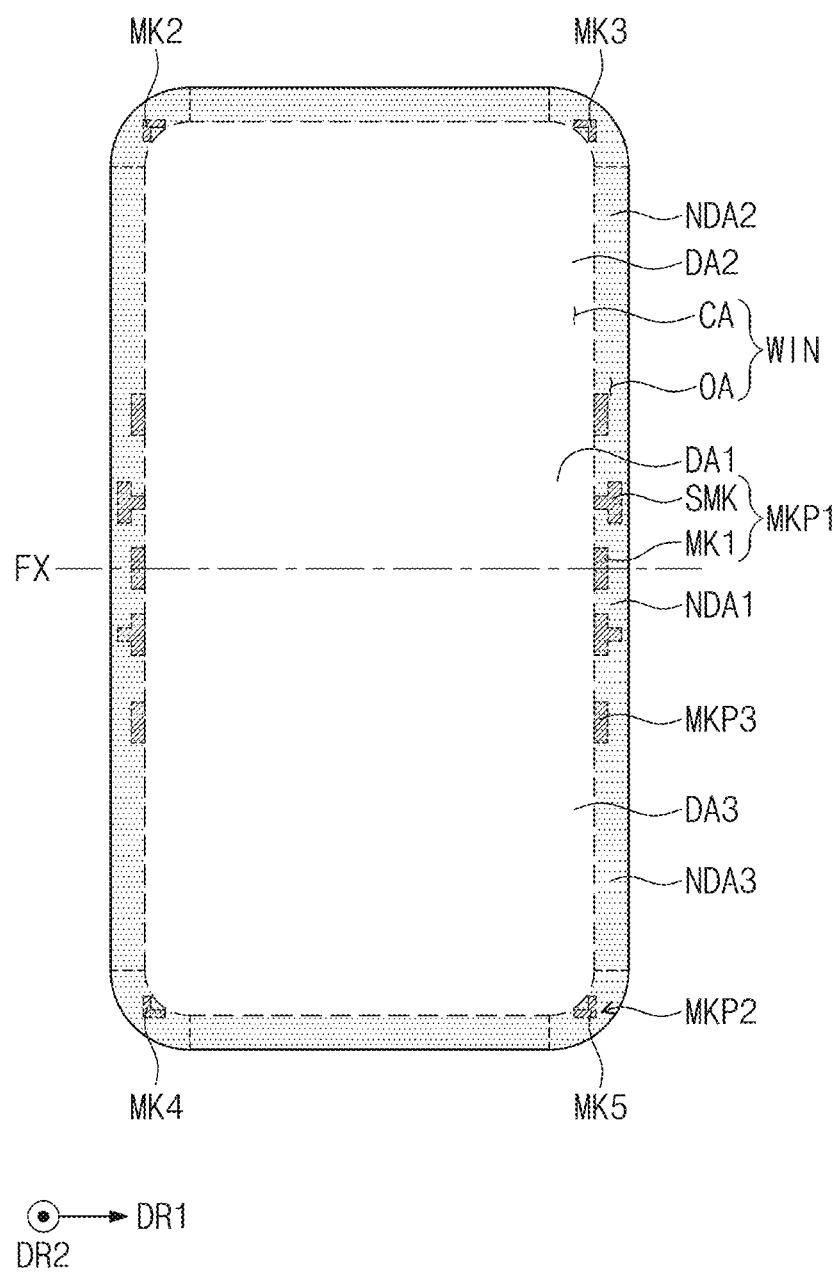
FIG. 23 is a plan view illustrating a state in which the window in FIG. 5 is disposed on the display panel in FIG. 22.

FIG. 23 is a plan view illustrating a state in which the window in FIG. 5 is disposed on the display panel in FIG. 22. For convenience of illustration and description, the window WIN in an unfolded state and the display panel DP' in an unfolded state and disposed below the window WIN are illustrated in FIG. 23.

Referring to FIGS. 5, 22, and 23, in an embodiment, the central area CA may overlap display areas DA1 to DA3, and the edge area OA may overlap non-display areas NDA1 to NDA3. The first marking part MKP1, the second marking part MKP2, and the third marking part MKP3 may be covered by the edge area OA and may not be recognized from the outside. However, for convenience of illustration and description, each of the first marking part MKP1, the second marking part MKP2, and the third marking part MKP3 disposed below the edge area OA is illustrated by a dotted line in FIG. 23.

According to an embodiment of the invention, the window WIN may be further exactly arranged on the display panel DP through the first to third marking parts MKP1 to MKP3 defined in the display panel DP.

Figure 24:
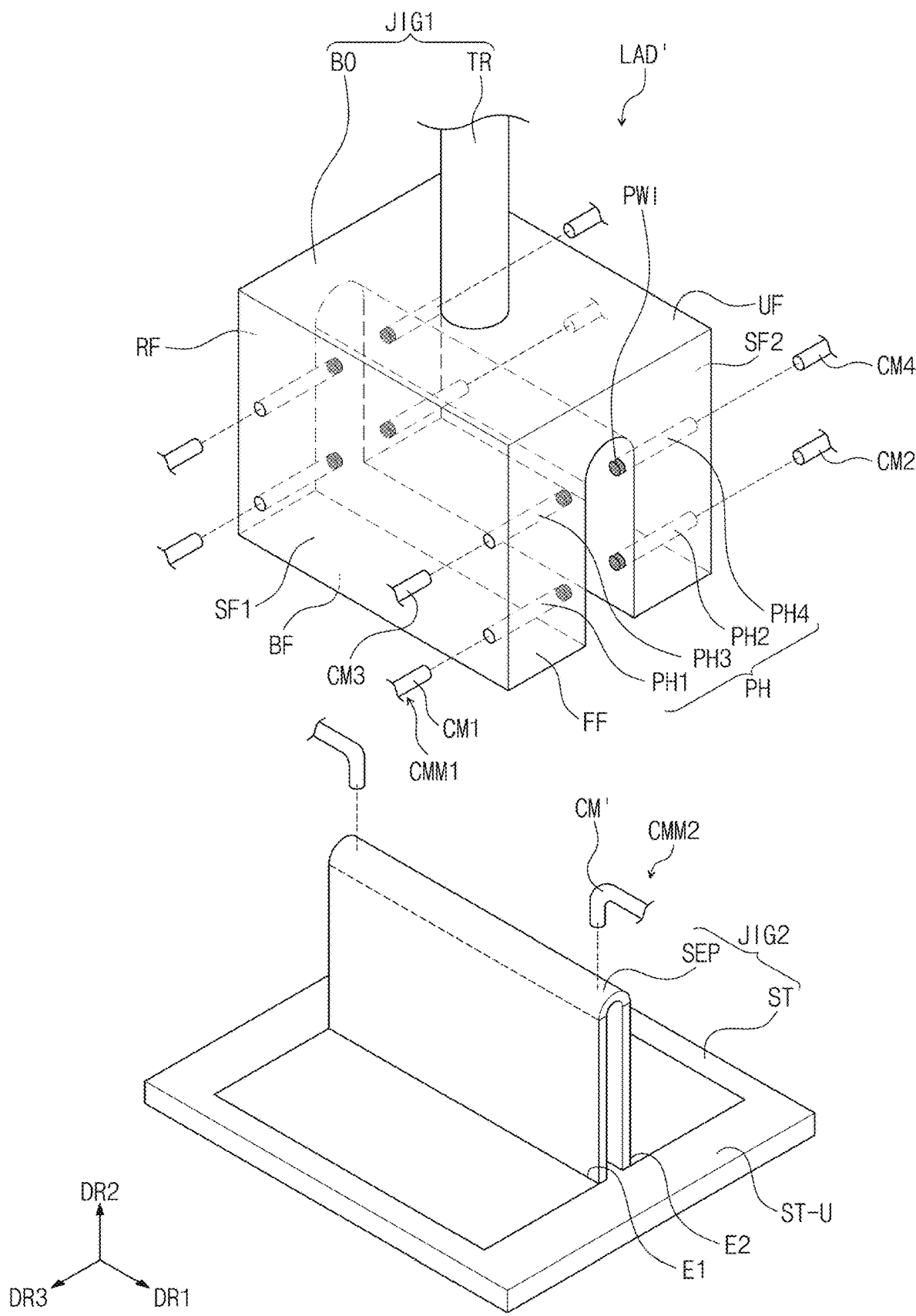
FIG. 24 is a perspective view illustrating a lamination device according to an alternative embodiment of the invention.
Figure 25:
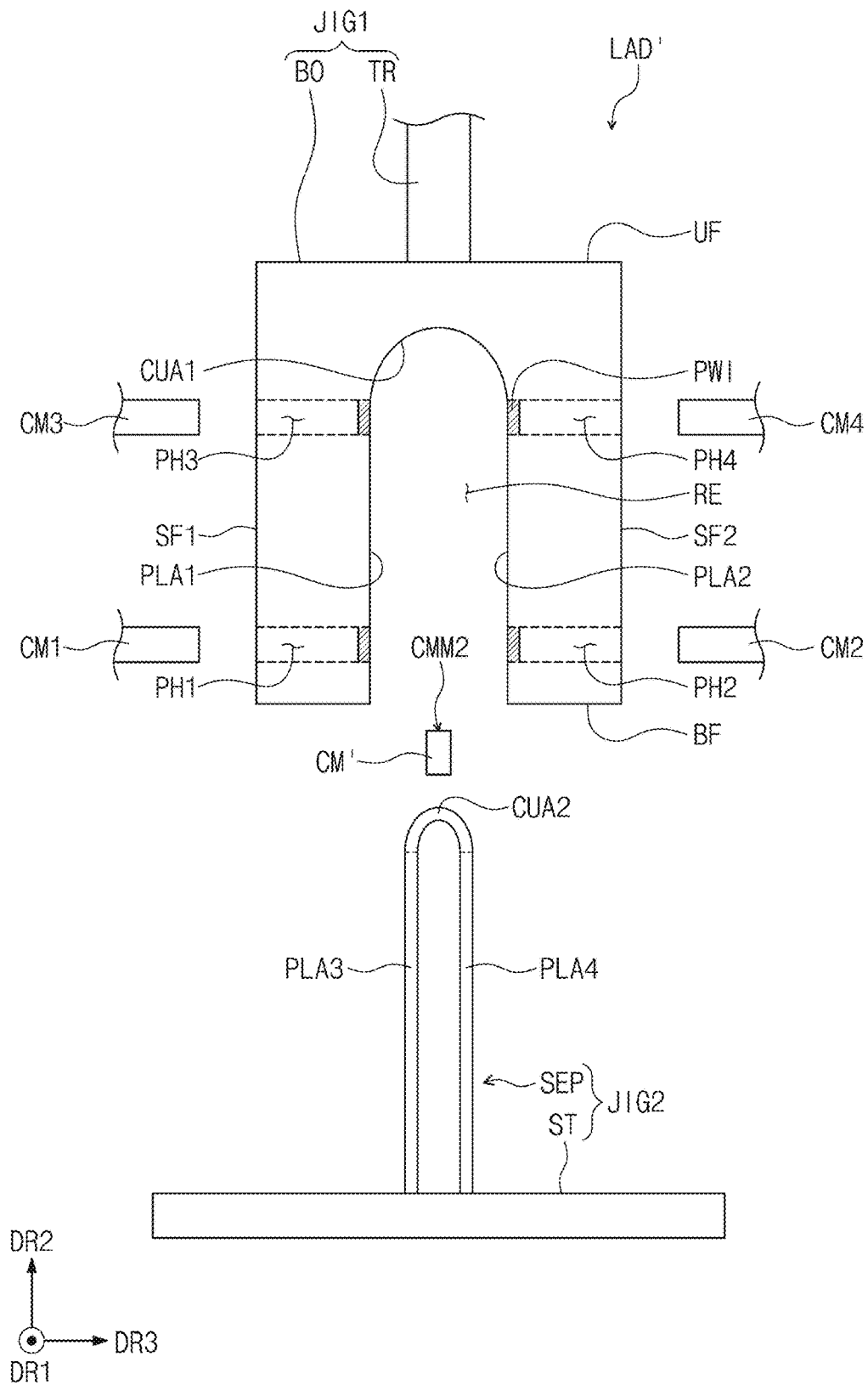
FIG. 25 is a front view illustrating the lamination device in FIG. 24.
Figure 26:
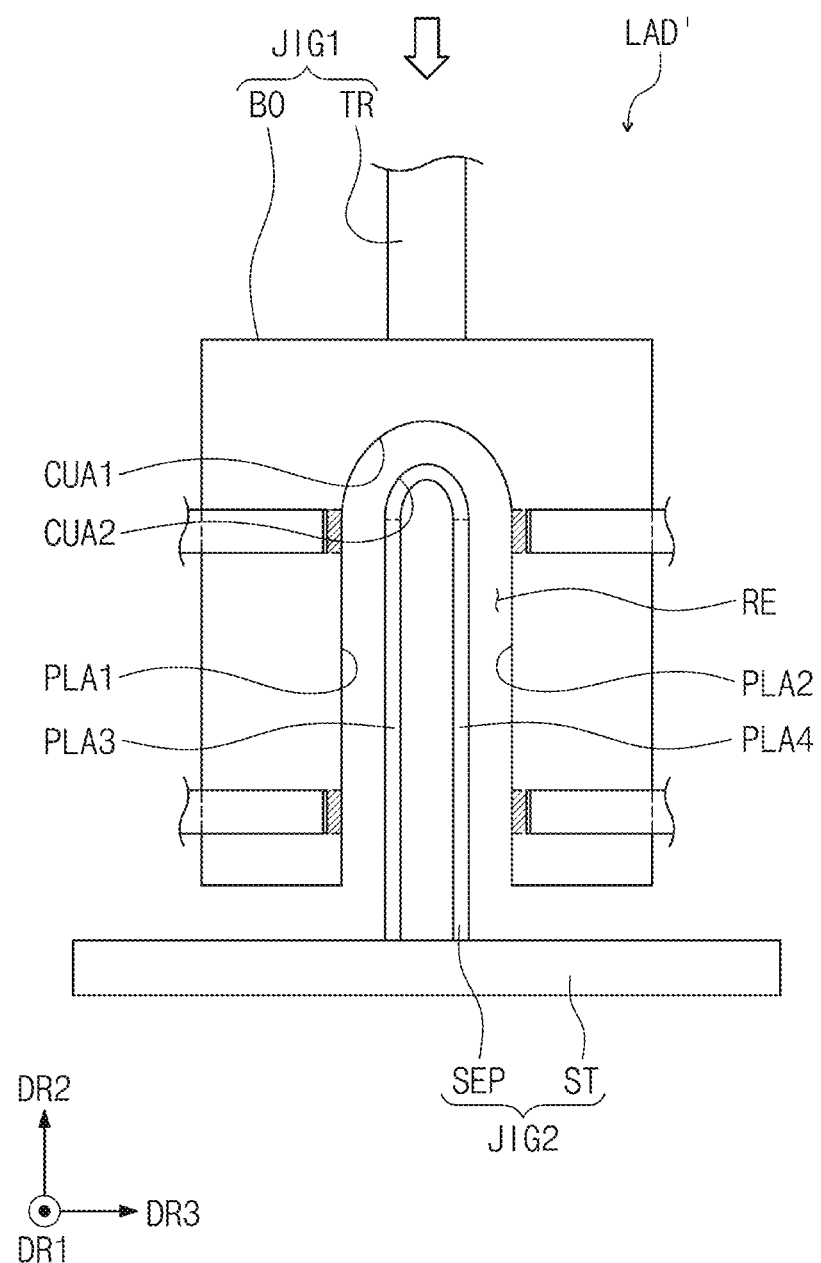
FIG. 26 is a view illustrating a state in which a first jig part and a second jig part in FIG. 25 are coupled to each other.

FIG. 24 is a perspective view illustrating a lamination device according to another alternative embodiment of the invention. FIG. 25 is a front view illustrating the lamination device in FIG. 24. FIG. 26 is a view illustrating a state in which a first jig part and a second jig part in FIG. 25 are coupled to each other.

Hereinafter, a constitution of a lamination device LAD' in FIGS. 24 to 26 will be described focused on components different from those of the lamination device LAD in FIGS. 7 to 9. The same or like elements shown in FIGS. 24 to 26 have been labeled with the same reference characters as used above to describe the embodiment of the lamination device LAD in FIGS. 7 to 9, and any repetitive detailed description thereof will hereinafter be omitted or simplified.

Referring to FIGS. 24 to 26, the lamination device LAD' may bond the window WIN to the display panel DP' in FIG. 22. The lamination device LAD' may include a first jig JIG1, a second jig JIG2, a first camera module CMM1, and a second camera module CMM2.

The lamination device LAD' may be substantially the same as the lamination device LAD in FIGS. 7 to 9 except that third and fourth through-holes PH3 and PH4 are further defined in the first jig JIG1, and the first camera module CMM1 further includes third and fourth cameras CM3 and CM4.

In such an embodiment, a through-hole PH may include the third through-hole PH3 and the fourth through-hole PH4. The third through-hole PH3 may extend from a first side surface SF1 to a first flat area PLA1 of a recessed part RE. The third through-hole PH3 may be disposed above the first through-hole PH1 in the second direction DR2. The fourth through-hole PH4 may extend from a second side surface SF2 to a second flat area PLA2 of the recessed part RE. The fourth through-hole PH4 may be disposed above the second through-hole PH2 in the second direction DR2.

According to an embodiment of the invention, each of the third through-hole PH2 and the fourth through-hole PH4 may be provided in plural. The plurality of third through-holes PH3 may be spaced apart from each other in the first direction DR1, and the plurality of fourth through-holes PH4 may be spaced apart from each other in the first direction DR1. When viewed in the third direction DR3, the third through-holes PH3 and the fourth through-holes PH4 may overlap each other. Transmission windows PWI may be further disposed a portion adjacent to the recessed part RE in the third and fourth through-holes PH3 and PH4.

The first camera module CMM1 may include a first camera CM1, a second camera CM2, a third camera CM3, and a fourth camera CM4, which are disposed adjacent to side surfaces SF1 and SF2 of the first jig JIG1. Each of the first camera CM1, the second camera CM2, the third camera CM3, and the fourth camera CM4 may be provided in plural.

The first to fourth cameras CM1 to CM4 may be disposed at the first to fourth through-holes PH1 to PH4, respectively. The first to fourth cameras CM1 to CM4 may photograph the inside of the recessed portion RE through the transmission windows PWI.

Referring to FIG. 26, the first jig JIG1 may be coupled to the second jig JIG2. Since a coupled structure between the first jig JIG1 and the second jig JIG2 is substantially the same as that described above with reference to FIG. 9, any repetitive detailed description thereof will be omitted.

The first and second cameras CM1 and CM2 may photograph the first to fourth corners WCP1 to WCP4 (refer to FIG. 5) of the window WIN through the first and second through-holes PH1 and PH2. The third and fourth cameras CM3 and CM4 may photograph the boundary between the first portion PP1 and the second portion PP2 of the window in FIG. 5 and the boundary between the first portion PP1 and the third portion PP3 of the window WIN through the third and fourth through-holes PH3 and PH4.

Thus, the window WIN may be allowed to be arranged at an exact position on the recessed part RE of the first jig JIG1 through the through-hole PH and the first camera module CMM1 disposed at the through-hole PH.

Figure 27:
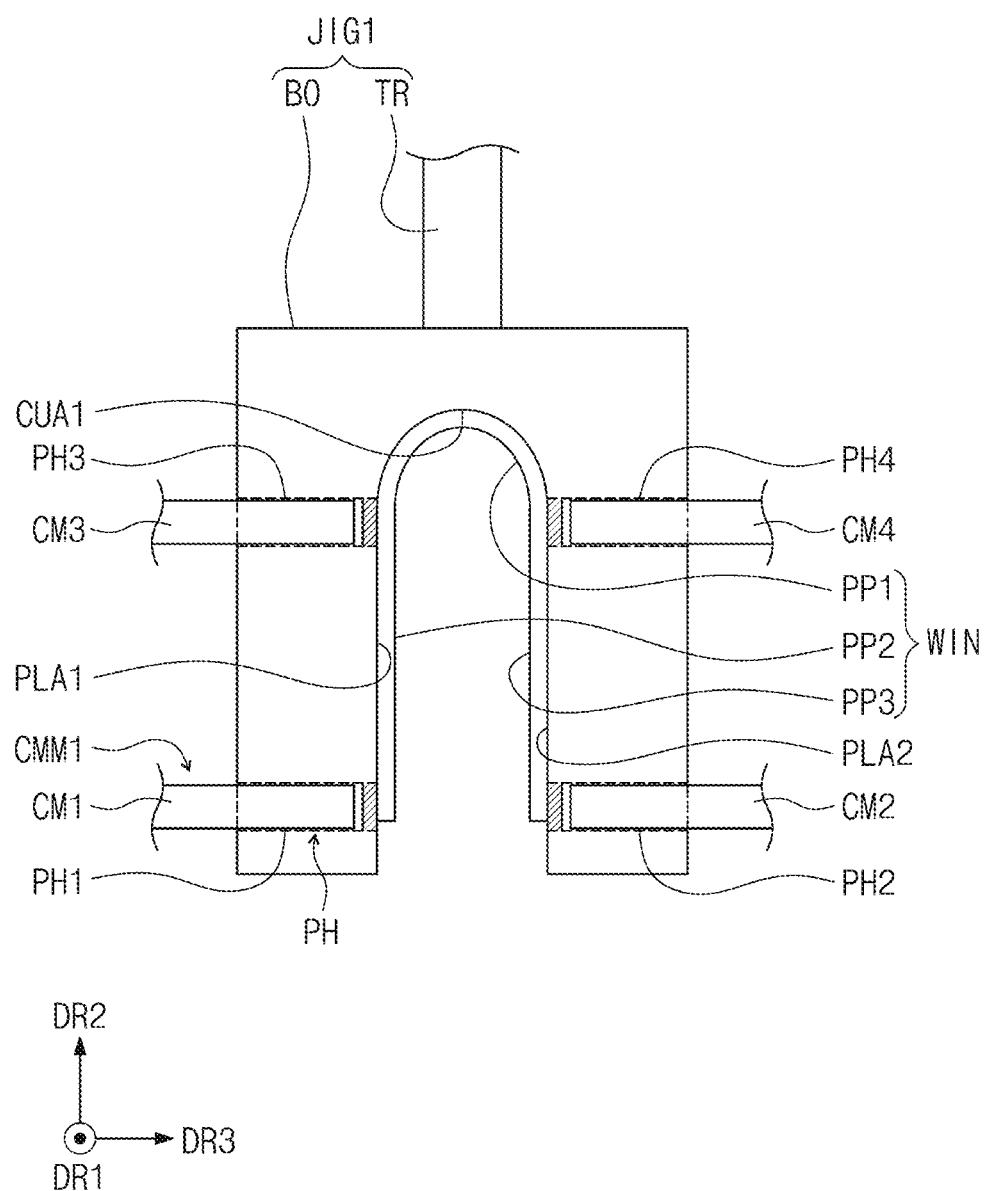
FIGS. 27 to 29 are views illustrating a method for manufacturing the display device according to an alternative embodiment of the invention.
Figure 28:
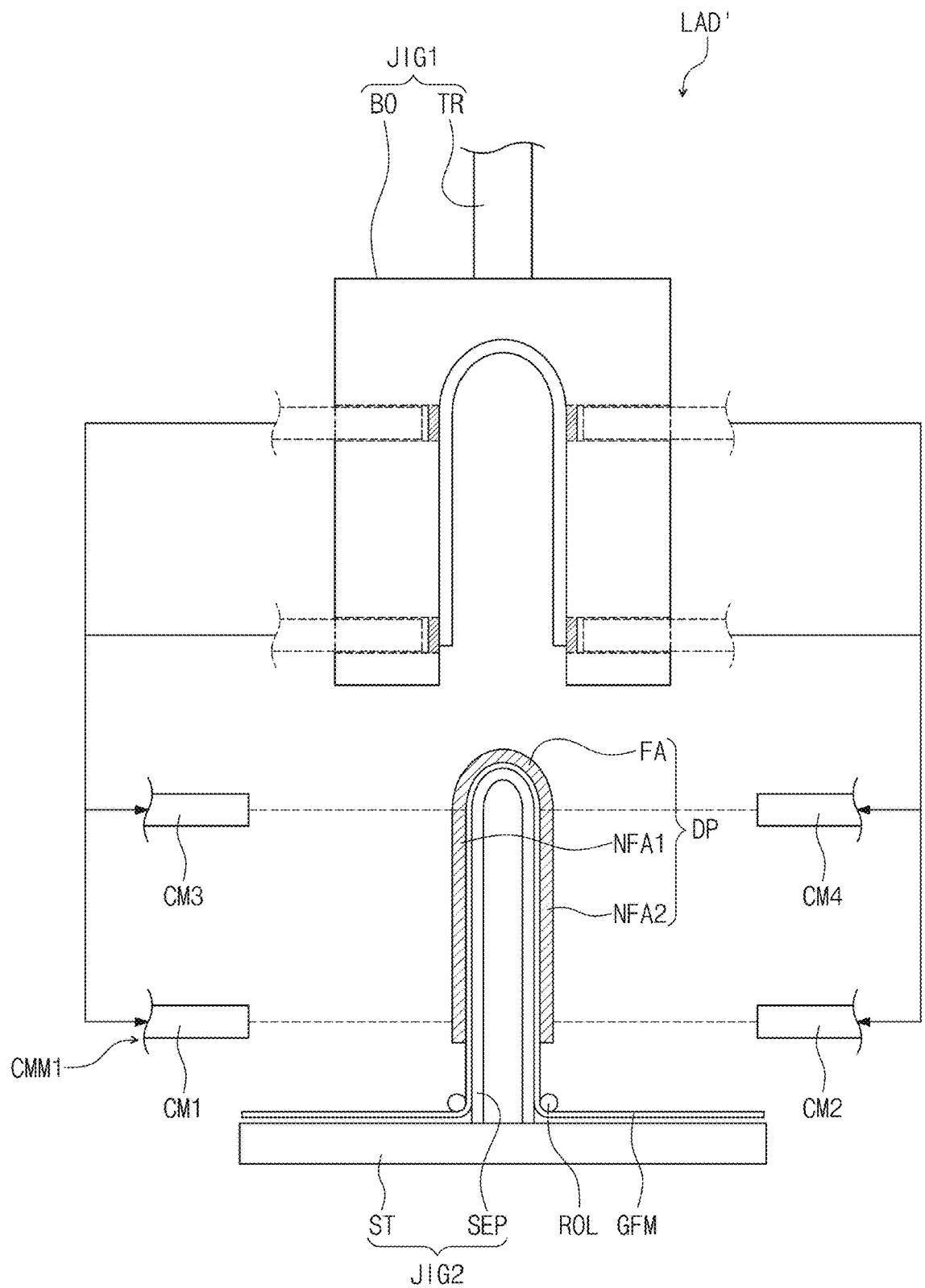
Figure 29:
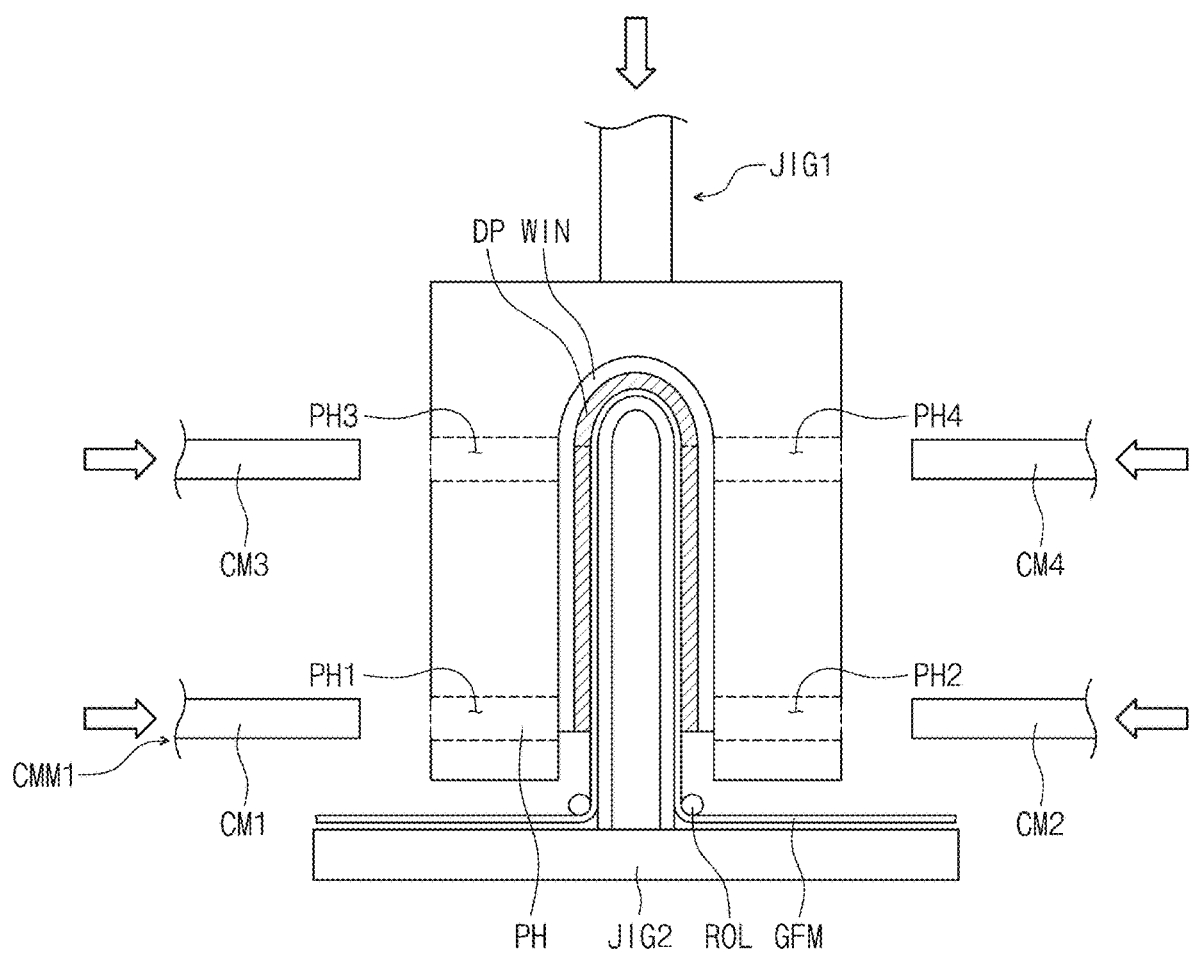

FIGS. 27 to 29 are views illustrating a method for manufacturing the display device according to an alternative embodiment of the invention.

FIGS. 27 to 29 may correspond to FIGS. 11, 18, and 20.

Referring to FIGS. 24 to 27, the window WIN may be provided in the recessed part RE defined in the first jig JIG1. The position of the window WIN may be adjusted until the boundary between the central area CA and the edge area OA of the window WIN is photographed by the first camera module CMM1 through the first to fourth through-holes PH1 to PH4. The above-described process may be substantially the same as that described above with reference to FIG. 11.

According to an embodiment of the invention, the boundary between the first portion PP1 and each of the second and third portions PP2 and PP3 of the window WIN may be photographed through the third and fourth cameras CM3 and CM4 disposed in the third and fourth through-holes PH3 and PH4, respectively. Thus, the position of the window WIN may be further exactly aligned in the recessed part RE through the first camera module CMM1 disposed in the through-holes PH.

Thereafter, the guide film GFM in FIG. 13 may be prepared, and the display panel DP' in FIG. 22 may be disposed on the guide film GFM. Thereafter, the processed in FIGS. 15 to 17 may be performed. In one embodiment, for example, as illustrated in FIGS. 15 to 17, the position of the display panel DP' may be adjusted so that the first alignment marks MK1 of the display panel DP' disposed on the seated part SEP overlaps the bending axis BX by using the second camera module CMM2, and then the display panel DP' may be folded.

Referring to FIGS. 24 and 28, the first camera module CMM1 may be moved from the first jig JIG1 to around the second jig JIG2 and photograph the display panel DP'. The second marking part MKP2 of the display panel DP' in FIG. 22 may be photographed by moving the first and second cameras CM1 and CM2.

The third and fourth cameras CM3 and CM4 disposed in the third and fourth through-holes PH3 and PH4, respectively, may be moved to photograph the boundary between the first non-folding area NFA1 and the folding area FA of the display panel DP' and the boundary between the second non-folding area NFA2 and the folding area FA. In one embodiment, for example, the third marking part MKP3 of the display panel DP' in FIG. 22 may be photographed by moving the third and fourth cameras CM3 and CM4.

Referring to FIGS. 24 and 29, the window WIN may be disposed on the display panel DP'. In such an embodiment, an alignment state between the window WIN and the display panel DP' may be checked through the first and second cameras CM1 and CM2. In one embodiment, for example, the first and second cameras CM1 and CM2 may be moved into the corresponding first and second through-holes PH1 and PH2, respectively, and photograph the corners of the window WIN.

In such an embodiment, as described above with reference to FIGS. 20 and 21, the position of the window WIN may be adjusted until the edge area OA of the window WIN overlaps the second alignment mark MK2 of the display panel DP'. In such an embodiment, the alignment state between the window WIN and the display panel DP' may be checked through the third and fourth cameras CM3 and CM4 and then precisely adjust the position of the window WIN.

Thereafter, in a state in which the window WIN and the display panel DP' are exactly arranged, the adhesive layer ADL may be cured to manufacture the display device.

According to embodiments of the invention, the window may be arranged at the exact position in the first jig through the through-hole defined in the first jig in which the window is disposed. In such embodiments, the window may be arranged at the exact position on the display panel through the through-hole even when the first jig descends and is coupled to the second jig.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A lamination device comprising:
   a first jig in which a window is disposed, wherein a recessed part is defined in a bottom surface of the first jig, and the window is disposed in the recessed part; and
   a second jig comprising a seated part to be disposed in the recessed part, wherein a display panel is seated on the seated part to face the window,
   wherein a through-hole extending from a side surface of the first jig to the recessed part of the first jig is defined in the first jig, and
   wherein the through-hole extends in a horizontal direction parallel to the bottom surface of the first jig.

2. The lamination device of claim 1, wherein the recessed part comprising:
   a first curved area bent with respect to a first direction;
   a first flat area extending from one side of the first curved area in a second direction crossing the first direction; and
   a second flat area extending from an opposing side of the first curved area in the second direction and facing the first flat area.

3. The lamination device of claim 2, wherein the through-hole includes a first through-hole extending from the first flat area to a first side surface of the first jig, which is opposed to the first flat area.

4. The lamination device of claim 3, wherein the through-hole further includes a second through-hole extending from the second flat area to a second side surface of the first jig, which is opposed to the second flat area.

5. The lamination device of claim 4, wherein
   the first flat area and the first side surface are parallel to each other,
   the second flat area and the second side surface are parallel to each other, and
   each of the first through-hole and the second through-hole extends in a third direction perpendicular to a plane defined by the first and second directions.

6. The lamination device of claim 4, wherein each of the first through-hole and the second through-hole is provided in plural.

7. The lamination device of claim 6, wherein when the window is disposed in the recessed part, corners of the window are recognized from the outside through the plurality of first through-holes and the plurality of second through-holes.

8. The lamination device of claim 4, wherein the through-hole further includes:
   a third through-hole extending from the first side surface to the first flat area; and
   a fourth through-hole extending from the second side surface to the second flat area,
   wherein the third through-hole is disposed above the first through-hole in the second direction, and
   the fourth through-hole is disposed above the second through-hole in the second direction.

9. The lamination device of claim 2, wherein the seated part comprises:
   a second curved area bent with respect to the first direction while facing the first curved area;
   a third flat area extending from one side of the second curved area in the second direction and facing the first flat area; and
   a fourth flat area extending from an opposing side of the second curved area in the second direction and facing the second flat area.

10. The lamination device of claim 9, wherein the second jig further comprises a stage on which the seated part is disposed,
    wherein a first end of the third flat area of the seated part and a second end of the fourth flat area of the seated part are movable on the stage to deform a shape of the second curved area.

11. The lamination device of claim 1, further comprising:
    a camera module comprising a camera disposed in the through-hole.

12. The lamination device of claim 1, wherein the first jig comprises a transmission window disposed in the through-hole, wherein the transmission window is optically clear.

13. A display device comprising:
    a display panel comprising a folding area bent with respect to a folding axis extending in a first direction, a first non-folding area extending from one side of the folding area in a second direction crossing the first direction, and a second non-folding area extending from an opposing side of the folding area in the second direction; and
    a window disposed on the display panel and comprising a central area and an edge area surrounding the central area,
    wherein a first marking part is defined in the folding area,
    a second marking part is defined in the non-folding area, and
    the first marking part and the second marking part overlap the edge area.

14. The display device of claim 13, wherein the folding area comprises:
    a first display area which displays an image; and first non-display areas disposed at opposing sides of the first display area with respect to the first direction, respectively, wherein no image is displayed on the first non-display areas, wherein the first marking part is defined in the first non-display areas.

15. The display device of claim 14, wherein the first marking part comprises:
   one pair of first alignment marks which overlaps the folding axis when viewed in the second direction; and
   a plurality of preliminary alignment marks disposed around the one pair of first alignment marks when viewed in the second direction.

16. The display device of claim 13, wherein the second marking part comprises:
   a second alignment mark defined in a first corner of the first non-folding area;
   a third alignment mark defined in a second corner of the first non-folding area,
   a fourth alignment mark defined in a third corner of the second non-folding area; and
   a fifth alignment mark defined in a fourth corner of the second non-folding area.

17. A method for manufacturing a display device, the method comprising:
   providing a window comprising a central area and an edge area surrounding the central area to a recessed part defined in a first jig;
   providing a display panel on a seated part of a second jig, which is disposed below the first jig, to face the window;
   arranging a first camera module to photograph an alignment mark defined in a non-folding area of the display panel;
   arranging the window on the display panel; and
   bonding the window to the display panel,
   wherein the arranging the window on the display panel comprises adjusting a position of the window until the edge area of the window overlaps the alignment mark of the display panel through a through-hole extending from a side surface of the first jig to the recessed part.

18. The method of claim 17, wherein the display panel comprises:
   a folding area which is foldable with respect to a folding axis extending in a first direction;
   a first non-folding area extending from one side of the folding area in a second direction crossing the first direction; and
   a second non-folding area extending from an opposing side of the folding area in the second direction and facing the first non-folding area.

19. The method of claim 18, wherein the providing of the display panel comprises:
   arranging the display panel in an unfolded state, in which the folding area is parallel to the first non-folding area and the second non-folding area, on the seated part;
   adjusting a position of the display panel in the unfolded state in a way such that one pair of alignment marks defined in the folding area of the display panel overlap a bending axis of the seated part; and
   folding the display panel in a way such that the first non-folding area and the second non-folding area face each other.

20. The method of claim 17, wherein the providing the window comprises adjusting the position of the window until a boundary between the central area and the edge area of the window is photographed by the first camera module through the through-hole.

\* \* \* \* \*